(12) United States Patent
Kim et al.

(10) Patent No.: US 11,797,115 B2
(45) Date of Patent: Oct. 24, 2023

(54) DISPLAY DEVICE INCLUDING A TOUCH SENSING UNIT

(71) Applicant: SAMSUNG DISPLAY CO., LTD., Yongin-si (KR)

(72) Inventors: Mi Young Kim, Yongin-si (KR); Kwang Hyeok Kim, Yongin-si (KR); Il Joo Kim, Yongin-si (KR); So Yeon Park, Yongin-si (KR); Yong Hwan Park, Yongin-si (KR); Hwan Hee Jeong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 75 days.

(21) Appl. No.: 17/457,543

(22) Filed: Dec. 3, 2021

(65) Prior Publication Data
US 2022/0179513 A1 Jun. 9, 2022

(30) Foreign Application Priority Data
Dec. 3, 2020 (KR) ........................ 10-2020-0167574

(51) Int. Cl.
*G06F 3/041* (2006.01)
*G06F 3/044* (2006.01)
*G09G 3/3266* (2016.01)
*H10K 59/40* (2023.01)
*H10K 59/131* (2023.01)

(52) U.S. Cl.
CPC .......... *G06F 3/0412* (2013.01); *G06F 3/0446* (2019.05); *G06F 3/04164* (2019.05); *G06F 3/041662* (2019.05); *G09G 3/3266* (2013.01); *H10K 59/131* (2023.02); *H10K 59/40* (2023.02); *G09G 2310/08* (2013.01)

(58) Field of Classification Search
CPC ............ G06F 3/0412; G06F 3/041662; G06F 3/0446; G06F 3/04164
USPC ................................................. 345/173, 174
See application file for complete search history.

(56) References Cited

U.S. PATENT DOCUMENTS

| 9,703,439 | B2 | 7/2017 | Shin et al. |
| 9,886,129 | B2 | 2/2018 | Kim et al. |
| 10,191,584 | B2 | 1/2019 | Shepelve |

(Continued)

FOREIGN PATENT DOCUMENTS

| KR | 10-1667163 | 10/2016 |
| KR | 1020180078571 | 7/2018 |

(Continued)

*Primary Examiner* — Calvin C Ma
(74) *Attorney, Agent, or Firm* — F. CHAU & ASSOCIATES, LLC

(57) ABSTRACT

A display device includes a display panel including pixels and a scan driver for driving the pixels. The pixels are in a display area and the scan driver is in a non-display area. A touch sensing unit is disposed on the display panel and includes touch electrodes disposed in a sensing area and touch sensing lines connected to the touch electrodes. The non-display area includes at least one multiplexer, the touch sensing lines are electrically connected to input terminals of the at least one multiplexer through touch contact holes formed on the display panel. Sensing channels electrically connected to output terminals of the multiplexer are parallel to the scan driver. The at least one multiplexer is disposed between the sensing channels and the scan driver.

27 Claims, 28 Drawing Sheets

(56) References Cited

U.S. PATENT DOCUMENTS

| | | |
|---|---|---|
| 10,824,259 B2 | 11/2020 | Jin et al. |
| 10,871,840 B2 | 12/2020 | Baek |
| 2018/0373379 A1 | 12/2018 | Shepelve |
| 2019/0025966 A1* | 1/2019 | Xing ........................ G06F 3/044 |
| 2019/0025968 A1 | 1/2019 | Xing et al. |
| 2021/0200366 A1* | 7/2021 | Bok ..................... H10K 59/122 |

FOREIGN PATENT DOCUMENTS

| | | |
|---|---|---|
| KR | 10-2019-0067298 | 6/2019 |
| KR | 10-2020-0039862 | 4/2020 |
| KR | 10-2177661 | 11/2020 |

\* cited by examiner

DISPLAY DEVICE INCLUDING A TOUCH SENSING UNIT

This application claims priority under 35 U.S.C. § 119 to Korean Patent Application No. 10-2020-0167574 filed Dec. 3, 2020, the content of which is herein incorporated by reference in its entirety.

TECHNICAL FIELD

Embodiments of the present invention relate to a display device and, more particularly, to a display device including a touch sensing unit.

DISCUSSION OF THE RELATED ART

Electronic devices such as smart phones, digital cameras, notebook computers, vehicle navigation systems, and smart televisions that provide images to users include display devices for displaying the images. The display devices include a display panel that generates and displays an image and may also include various input devices.

A touch sensor that recognizes a touch input has been widely applied to the display device, especially in display devices that are used in smartphones or tablet PCs. There is a trend for touch sensors to replace existing physical input devices such as a keypad due to the added convenience of using touch input and the more convenient form factor of devices that lack keyboards.

Many such touch sensors utilize a mutual capacitance method or a self-capacitance method. The mutual capacitance method senses a touch by identifying a change in capacitance between two conductive layers of a plurality of touch electrodes that are arranged in rows and columns. However, as the size of the display device becomes larger, an RC delay may be created thereby leading to less reliable touch sensing. The self-capacitance method has therefore been recognized as an alternative to using the mutual capacitance method for larger display devices.

SUMMARY

A display device includes a display panel and a scan driver. Pixels are disposed in a display area and a scan driver is disposed in a non-display area. A touch sensing unit is disposed on the display panel. The non-display area includes a multiplexer, the touch sensing unit is electrically connected to the multiplexer through holes formed on the display panel. Sensing channels electrically connected to the multiplexer are parallel to the scan driver, and the multiplexer is disposed between the scan driver and the sensing channels.

A display device includes a display panel including pixels and a scan driver for driving the pixels. The pixels are disposed in a display area and the scan driver is disposed in a non-display area. A touch sensing unit is disposed on the display panel and includes touch electrodes disposed in a sensing area and touch sensing lines connected to the touch electrodes.

The non-display area includes at least one multiplexer, the touch sensing lines are electrically connected to input terminals of the multiplexer through touch contact holes formed on the display panel. Sensing channels electrically connected to output terminals of the multiplexer are parallel to the scan driver, and a multiplexer is disposed between the scan driver and the sensing channels.

The multiplexer may include a plurality of switching elements, and gate control lines for controlling the switching elements are disposed on one side of the multiplexer.

The number of touch sensing lines may be greater than the number of sensing channels.

The sensing channels and the gate control lines may be disposed on opposite sides of the multiplexer.

The gate control lines may be disposed in parallel to the sensing channels.

The scan driver may include stages for providing a scan signal to each of the pixels.

Scan control lines for driving the stages may be disposed on one side of the stages.

The scan control lines may include a first clock signal line, a second clock signal line, and a scan start signal line.

The scan control lines may be disposed between the sensing channels and the stages.

The display device may further include a second power voltage line parallel to the scan control lines in an extension direction, wherein a second power voltage supplied through the second power voltage line is a DC voltage.

The second power voltage line may be disposed between the gate control lines and the scan control lines.

The sensing channels may be disposed between the second power voltage line and the scan control lines.

The display device may further include a touch driving voltage line and a touch ground voltage line disposed between the scan control lines and the gate control lines.

The touch sensing unit may include a conductive layer and an insulating layer.

The conductive layer may include the touch electrode and the touch sensing lines.

A display device includes a display panel including pixels and a scan driver for driving the pixels. The pixels are disposed in a display area and the scan driver is disposed in a non-display area. A touch sensing unit is disposed on the display panel and includes touch electrodes disposed in a sensing area and touch sensing lines connected to the touch electrodes.

The non-display area includes at least one multiplexer, the touch sensing lines are electrically connected to input terminals of the multiplexer through a touch contact hole formed in the display panel, and sensing channels electrically connected to output terminals of the multiplexer are connected to touch signal pads formed in one area of the non-display area. Scan control lines for controlling the scan driver are connected to display signal pads formed in one area of the non-display area. The touch signal pad and the display signal pads are disposed on opposite sides of the display panel.

The multiplexer may include a plurality of switching elements, and gate control lines for controlling the switching elements may be disposed on one side of the multiplexer.

The sensing channels and the gate control lines may be disposed on opposite sides of the multiplexer.

The display device may further include a second power voltage line connected to the display signal pad, wherein the gate control lines may be disposed between the second power voltage line and the multiplexer.

The scan control lines may include a first clock signal line, a second clock signal line, and a scan start signal line.

A display device includes a display panel including pixels and a scan driver for driving the pixels. The pixels are disposed in a display area and the scan driver is disposed in a non-display area. A touch sensing unit is disposed on the display panel and includes touch electrodes disposed in a sensing area and touch sensing lines connected to the touch electrodes.

The non-display area includes at least one multiplexer, the touch sensing lines are electrically connected to input terminals of the multiplexer through touch contact holes formed in the display panel. Sensing channels electrically connected to output terminals of the multiplexer are parallel to the scan driver. A second power voltage line is disposed between the sensing channels and the scan driver and is parallel to the sensing channels and the scan driver.

The multiplexer may include a plurality of switching elements, and gate control lines for controlling the switching elements are disposed on one side of the multiplexer.

The sensing channels and the gate control lines may be disposed on opposite sides of the multiplexer.

The display device may further include a touch driving voltage line and a touch ground voltage line disposed between the multiplexer and the gate control lines.

The scan driver may include stages for providing a scan signal to each of the pixels, scan control lines for driving the stages may be disposed on one side of the stages, and the scan control lines may include a first clock signal line, a second clock signal lines, scan start signal lines, and the like.

The scan control lines may be disposed between the second power voltage line and the stages.

A second power voltage supplied through the second power voltage line may be a DC voltage.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

Figure 1:
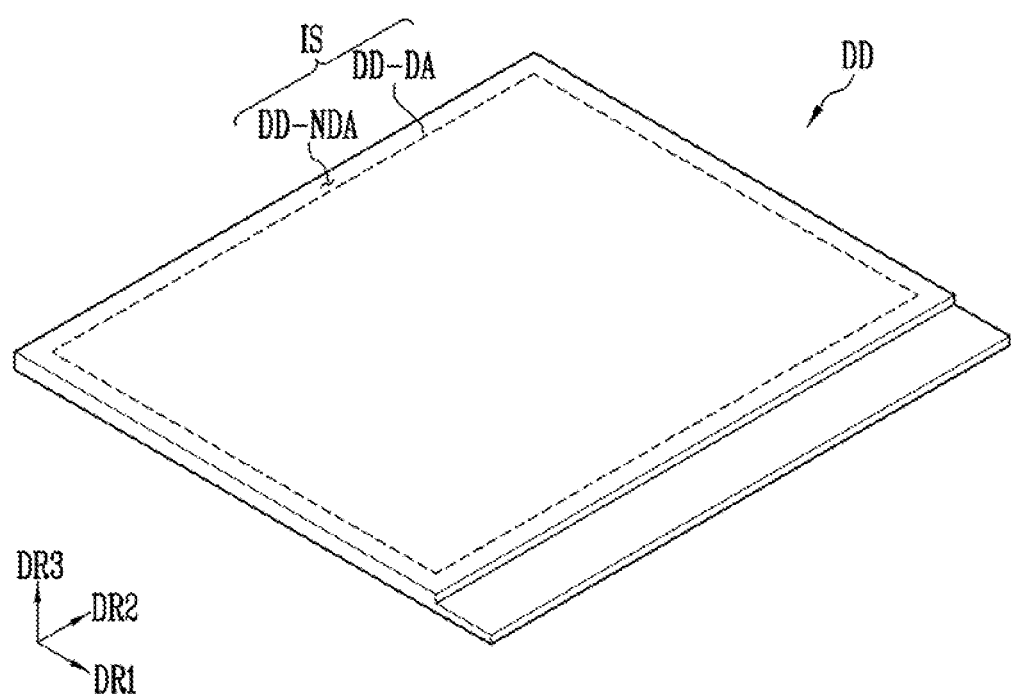
FIG. 1 is a perspective view illustrating a display device according to an embodiment of the present invention.

Aspects and features of the present invention, and implementation methods thereof will be clarified through following embodiments described with reference to the accompanying drawings. The present invention may, however, be embodied in different forms and should not necessarily be construed as limited to the embodiments set forth herein. Rather, these embodiments are provided so that this disclosure will be thorough and complete, and will fully convey the scope of the present invention to those skilled in the art.

It will be understood that when an element or a layer is referred to as being 'on' another element or layer, it can be directly on another element or layer, or intervening element or layer may also be present.

Although the terms "first", "second", "third", "fourth", and the like are used to describe various constituent elements, these constituent elements are not necessarily limited by these terms. These terms are used only to distinguish one constituent element from another constituent element. Therefore, the first constituent elements described below may be one of the second constituent elements, the third constituent elements, and the fourth constituent elements within the technical spirit of the present invention.

Embodiments described in the present specification will be described with reference to plan views and cross-sectional views which may be idealized schematic drawings. Accordingly, the shape of an exemplary drawing may be modified by manufacturing technology and/or tolerance. Accordingly, embodiments of the present invention are not necessarily limited to the specific shape shown, and may also include a change in the shape generated according to the manufacturing process.

As discussed above, touch sensors that are used in display panels may operate in accordance with a mutual capacitance method in which two conductive layers are used but as the display panels get larger, an RC delay may occur.

Since the self-capacitance method uses one conductive layer, even if the display device becomes larger, the problem due to RC delay is relatively small compared to the mutual capacitive method. However, since each of the plurality of touch electrodes arranged in rows and columns is separately driven, space constraints may be large in designing signal lines and pads for driving the touch sensor compared to the mutual capacitance method. To overcome this, a multiplexer may be used, but the multiplexer may cause an increase in dead space in which no image is displayed. This dead space may lead to a large bezel area.

In addition, due to space constraints, lines for driving the touch sensor and lines for driving the display panel may be disposed adjacent to each other. As a result, signal interference occurs between lines for driving the touch sensor and lines for driving the display panel, and thus noise may be introduced into the touch sensor detection signal.

Embodiments of present invention may provide a display device minimizing dead space and reducing noise generated from lines for driving a display panel and may include a touch sensor utilizing a self-capacitance method.

The objectives of the present invention are not necessarily limited to the objectives mentioned above, and other technical objectives that are not mentioned may be clearly understood to a person of an ordinary skill in the art using the following description.

The display device may change an arrangement of lines (e.g., sensing channels, a driving voltage line, and a ground voltage line) for driving a touch sensor and circuits (e.g., a multiplexer, a pad unit) formed on a substrate, thereby minimizing a dead space and reducing noise generated from lines for driving a display panel.

Hereinafter, embodiments will be described with reference to the accompanying drawings.

FIG. 1 is a perspective view illustrating a display device according to an embodiment of the present invention.

As shown in FIG. 1, a display surface IS on which the image is displayed may be on a plane defined by a first direction DR1 and a second direction DR2. The normal direction of the display surface IS may be a thickness direction (or a third direction DR3) of the display device DD. The front surface (or upper surface) and the rear surface (or lower surface) of each member may be divided by the third direction DR3. However, the directions indicated by the first to third directions DR1, DR2, and DR3 may be changed as these directions are a relative concept. Hereinafter, the first to third directions may refer to the same reference numerals as directions indicated by the first to third directions DR1, DR2, and DR3, respectively.

The display device DD, according to an embodiment of the present invention, may be a flat rigid display device DD. However, the present invention is not necessarily limited thereto, and the display device, according to an embodiment of the present invention, may be a flexible display device DD. The display device DD, according to an embodiment of the present invention, may be applied to small and medium-sized electronic devices such as mobile phones, tablets, car navigation systems, game consoles, and smart watches, as well as large electronic devices such as televisions, monitors, and the like.

As shown in FIG. 1, the display device DD may include a display area DD-DA in which an image is displayed and a non-display area DD-NDA adjacent to the display area DD-DA. The non-display region DD-NDA is the region where the image is not displayed. For example, the display area DD-DA may have a rectangular shape. The non-display area DD-NDA may at least partially surround the display area DD-DA. However, the present invention is not necessarily limited thereto, and the display area DD-DA and the non-display area DD-NDA may have various shapes.

Figure 2:
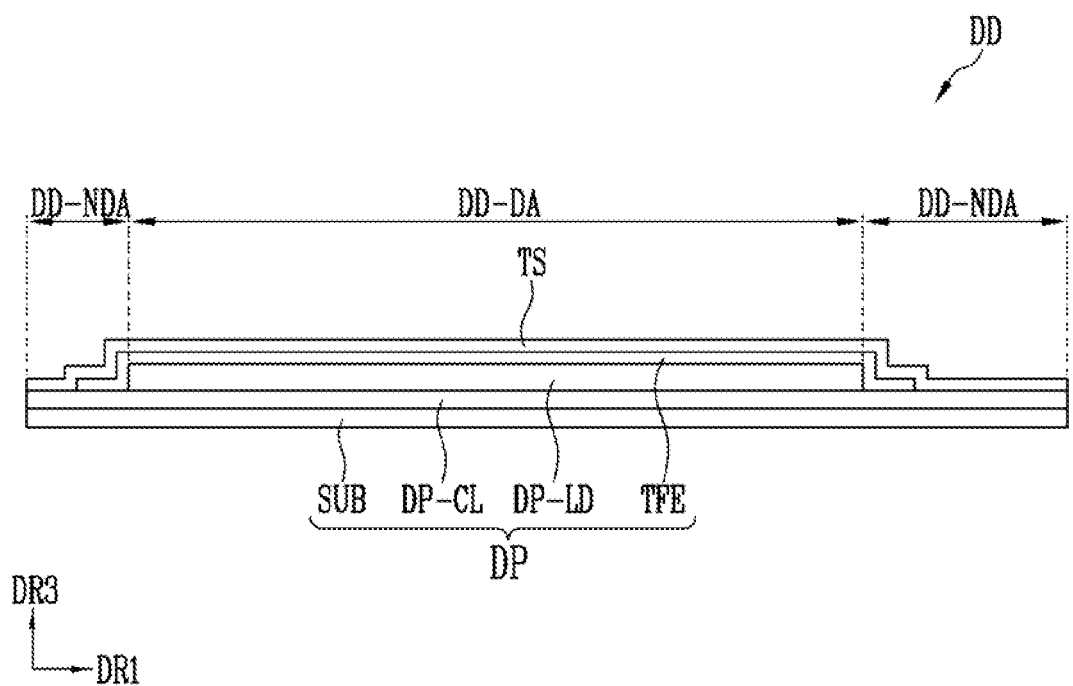
FIG. 2 is a cross-sectional view illustrating a display device according to an embodiment of the present invention.

FIG. 2 is a cross-sectional view illustrating a display device according to an embodiment of the present invention. In this case, FIG. 2 shows a cross section defined by the first direction DR1 and the third direction DR3.

As shown in FIG. 2, the display device DD may include a display panel DP and a touch sensing unit TS (or a touch sensing layer). The display device DD, according to an embodiment of the present invention, may further include a protective member disposed on a lower surface of the display panel DP, an antireflection member and/or a window member disposed on an upper surface of the touch sensing unit TS.

The display panel DP may include pixels for displaying an image, and may be a display panel of various types and/or structures. For example, the display panel DP may be a display panel capable of self-emission such as an organic light-emitting display panel (OLED panel) using an organic light-emitting diode as a light-emitting element, a nano-scale LED display panel (Nano LED panel) using a ultra-small light-emitting diode as a light-emitting element, a quantum dot organic light-emitting display panel (QD OLED panel) using an organic light-emitting diode and a quantum dot, a quantum dot nano-scale LED display panel (QD Nano LED panel) using an ultra-small light-emitting diode and a quantum dot. Alternatively, the display panel DP may be a non-emissive display panel such as a liquid crystal display panel (LCD panel), an electro-phoretic display panel (EPD panel), and an electro-wetting display panel (EWD panel). When a non-emissive display panel is used as the display panel DP, the display device DD may further include a separate light source device (e.g., a backlight unit) for supplying light to the display panel DP. Hereinafter, the display panel DP may be described as an organic light-emitting display panel by way of example and it may be understood that other types of display panels, such as those listed above, may be used in its place.

The display panel DP may include a base layer SUB, a circuit element layer DP-CL disposed on the base layer SUB, a display element layer DP-LD, and a thin film encapsulation layer TFE having, for example, the arrangement shown. The display panel DP may further include functional layers such as an antireflection layer, a refractive index control layer, and the like.

The base layer SUB may include at least one plastic film. The base layer SUB may be a flexible substrate capable of being flexed beyond a nominal degree without breaking, and may include a plastic substrate, a glass substrate, a metal substrate, an organic/inorganic composite material substrate, and the like. The display area DD-DA and the non-display area DD-NDA described with reference to FIG. 1 may be defined in the base layer SUB.

The circuit element layer DP-CL may include at least one intermediate insulating layer and a circuit element. The intermediate insulation layer may contain at least one intermediate inorganic layer and at least one intermediate organic layer. The circuit element may include signal lines, a driving circuit of a pixel, and the like. A detailed description of this is described below.

The display element layer DP-LD may include light-emitting elements. The display element layer DP-LD may further include an organic layer such as a pixel definition layer.

The thin film encapsulation layer TFE may seal the display element layer DP-LD. The thin film encapsulation layer TFE may include at least one inorganic layer (hereinafter, referred to as encapsulation inorganic layer). The thin film encapsulation layer TFE may further include at least one organic layer (hereinafter, referred to an encapsulation organic layer). The encapsulation inorganic layer may protect the display element layer DP-LD from moisture/oxygen, and the encapsulation organic layer may protect the display element layer DP-LD from foreign substances such as dust particles. The encapsulating inorganic layer may include a silicon nitride layer, a silicon oxy nitride layer, a silicon oxide layer, a titanium oxide layer, an aluminum oxide layer, or the like. The encapsulation organic layer may include an acrylic organic layer, but is not necessarily limited thereto.

A touch sensing unit TS may acquire coordinate information of an external input. The touch sensing unit TS may be disposed directly on the organic light-emitting display panel DP. In the present specification, "disposed directly" means that the first element is formed on the second element without any intervening layers or adhesives disposed therebetween.

The touch sensing unit TS may have a multilayer structure. The touch sensing unit TS may include a single layer or multiple layers of conductive materials. The touch sensing unit TS may include a single layer or multiple layers of insulating materials. The touch sensing unit TS may sense an external input, for example, using a capacitive method.

Figure 3:
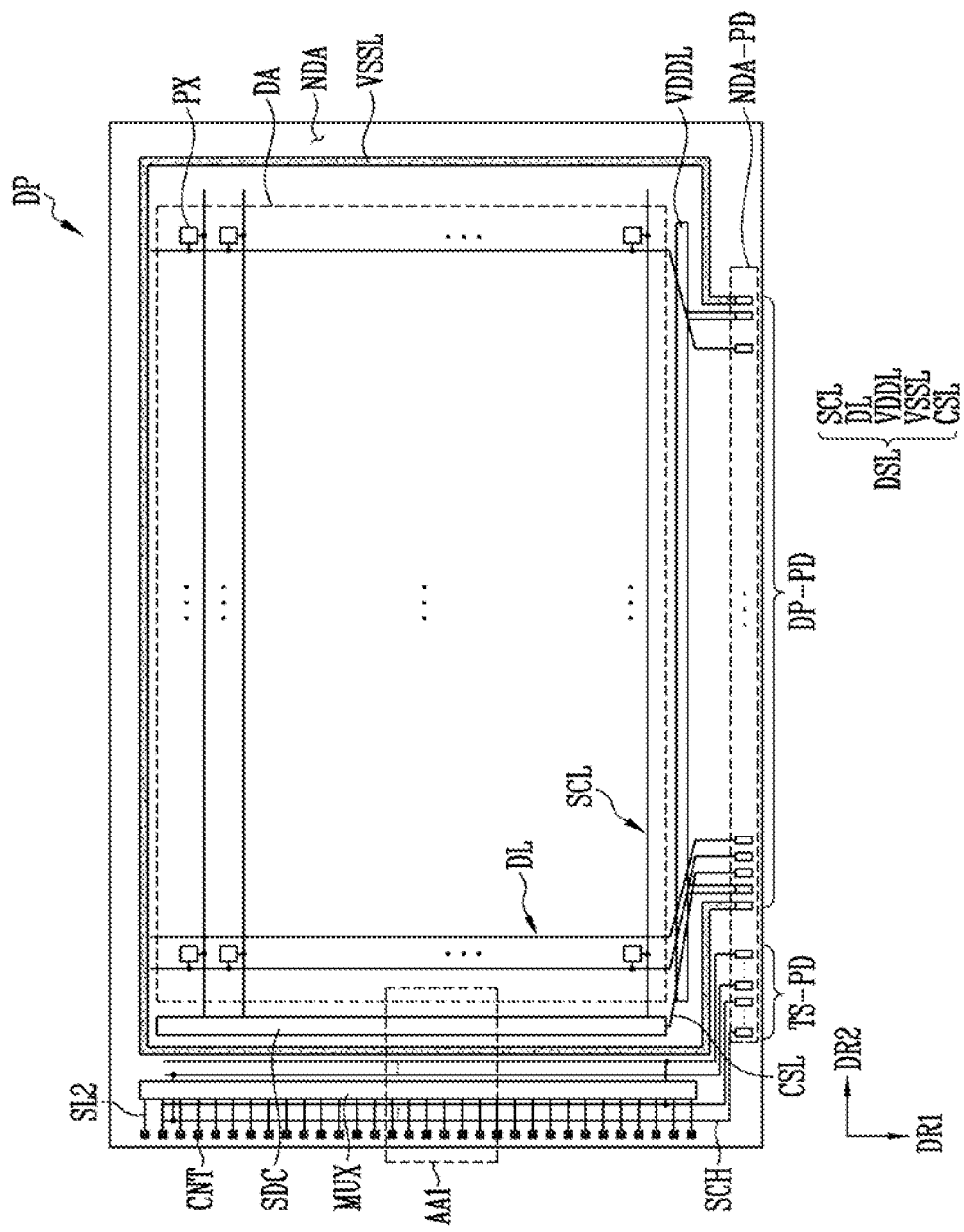
FIG. 3 is a plan view illustrating a display panel according to an embodiment of the present invention.
Figure 4:
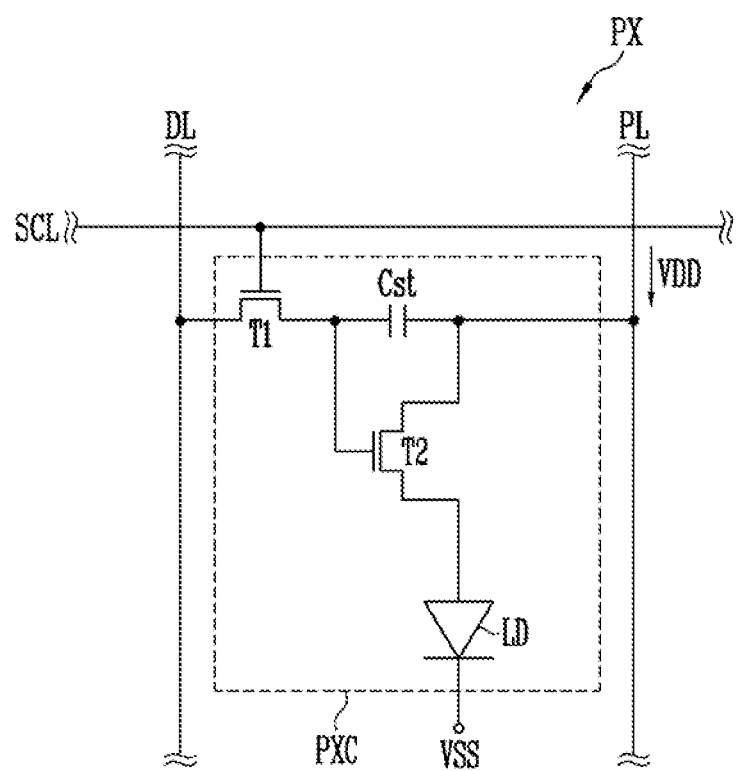
FIG. 4 is an equivalent circuit diagram illustrating a pixel according to an embodiment of the present invention.

FIG. 3 is a plan view illustrating a display panel according to an embodiment of the present invention. FIG. 4 is an equivalent circuit diagram of a pixel according to an embodiment of the present invention.

Referring to FIGS. 1 to 3, the display panel DP may include a display area DA and a non-display area NDA. In this embodiment, the non-display area NDA may be defined along a border of the display area DA. The display area DA and the non-display area NDA of the display panel DP may respectively correspond to the display area DD-DA and the non-display area DD-NDA of the display device DD shown in FIG. 1. The display area DA and the non-display area NDA of the display panel DP do not necessarily have to be the same as the display area DD-DA and the non-display area DD-NDA of the display device DD, and may be changed according to the structure/design of the panel DP.

According to an embodiment of the present invention, the display panel DP may further include a circuit for driving a touch sensing unit TS, touch signal lines, and touch contact holes CNT, which are described below, as well as a driving circuit for driving a pixel PX and display signal lines DSL.

For example, the driving circuit for driving the pixel PX may include a scan driver SDC, and the display signal lines DSL for driving the pixel PX may include scan lines SCL, data lines DL, a first power voltage line VDDL, a second power voltage line VSSL, and scan control lines CSL.

A plurality of pixels PX may be disposed in the display area DA. Each of the pixels PX may include a light-emitting element and a pixel driving circuit connected thereto. The scan driver SDC, the display signal lines DSL, and the pixel driving circuit may be included in the circuit element layer DP-CL shown in FIG. 2.

The scan driver SD may generate a plurality of scan signals, and may sequentially output the plurality of scan signals to a plurality of scan lines SCL, which is described below. The scan driver SD may further output another control signal to the driving circuit of the pixels PX.

The scan driver SD may include a plurality of thin film transistors formed through the same process as the driving circuit of the pixels PX, for example, a low temperature polycrystalline silicon (LTPS) process or a low temperature polycrystalline oxide (LTPO) process.

The scan lines SCL may be respectively connected to corresponding pixels PX among the plurality of pixels PX, and the data lines DL may be respectively connected to corresponding pixels PX among the plurality of pixels PX. The first and second power voltage lines VDDL and VSSL may be connected to the plurality of pixels PX. The scan control lines CSL may provide control signals to the scan driver SD. For example, the scan control line CSL may include a scan start signal line and first and second clock signal lines.

The display panel DP may include signal pads DP-PD connected to ends of the display signal lines DSL. The display signal pads DP-PD may be a kind of circuit element. An area in which the display signal pads DP-PD are disposed among the non-display area NDA may be defined as a pad area NDA-PD. Touch signal pads TS-PD connected to touch signal lines described below may also be disposed in the pad area NDA-PD.

The first power voltage line VDDL may supply a first power voltage VDD (refer to FIG. 4) to the pixel PX, and the second power voltage line VSSL may supply a second power voltage VSS (refer to FIG. 4) to the pixel PX. For example, the first power voltage VDD may be a high DC power voltage applied to the light-emitting element LD (refer to FIG. 4), and the second power voltage VSS may be a low DC power voltage applied to the light-emitting element LD.

The first power voltage line VDDL may have a linear shape corresponding to a lower edge of the display area DA. For example, the first power voltage line VDDL may generally extend in the second direction DR2 and may be branched in the first direction DR1 in one area to be electrically connected to the display signal pads DP-PD. It is understood that three-dimensional objects may extend in multiple directions. Therefore, as used herein, the phrase "extends" is intended to relate to a primary direction of extension, for example, a direction in which an element extends to a greatest extent.

The second power voltage line VSSL may at least partially surround the display area DA. For example, the second power voltage line VSSL may correspond to the shape of the display area DA. For example, when the display area DD-DA has a rectangular shape, the second power voltage line VSSL may also have a rectangular shape. The second power voltage line VS SL may extend in the first direction DR1 in one area (e.g., a lower side of the display area DA) to be electrically connected to the display signal pads DP-PD.

The total maximum current capacity for driving the plurality of light-emitting elements LD included in the plurality of pixels PX may be at the level of several tens of amps, and the current capacity for the power voltage may increase as the display device DD becomes larger. Accordingly, widths of the first power voltage line VDDL and the second power voltage line VSSL may increase.

The circuit for driving the touch sensing unit TS, which is described below, may include a multiplexer MUX, and the touch signal lines for driving the touch sensing unit TS may include gate control lines GCL, a touch driving voltage line VDL, and a touch ground voltage line VGL.

The plurality of touch contact holes CNT may be disposed in the non-display area NDA. According to an embodiment of the present invention, the touch contact holes CNT may be disposed in a left non-display area NDA of the display panel DP. For example, the touch contact holes CNT may be arranged in a line in the first direction DR1 along the left edge of the display panel DP. However, the arrangement of the touch contact holes CNT is not necessarily limited thereto, and the touch contact holes CNT may be arranged on a right or an upper non-display area NDA.

The number of touch contact holes CNT may match the number of touch electrodes TE formed on the thin film encapsulation layer TFE described below. The first touch sensing lines SL1 connected to each of the plurality of touch electrodes TE may be connected to the input terminal of the multiplexer MUX formed in the circuit element layer DP-CL through the touch contact holes CNT.

The multiplexer MUX may be disposed between the touch sensing unit TS and the touch signal pads TS-PD in terms of a flow of the sensing signal. The touch sensing unit TS may include touch electrodes TE and a first touch sensing line SL1. One end of the first touch sensing line SL1 may be connected to the touch electrode TE, and the other end thereof may be connected to the second touch sensing line SL2 through the touch contact hole CNT. In this case, the first touch sensing line SL1 may be formed on the thin film encapsulation layer TFE, and the second touch sensing line SL2 may be formed in the circuit element layer DP-CL.

The multiplexer MUX may select some of the plurality of second touch sensing lines SL2 and connect them to sensing channels SCH connected to the output terminal. The number of second touch sensing lines SL2 may be greater than the number of sensing channels SCH. In FIG. 3, one multiplexer MUX is shown for convenience of description, but the present invention is not necessarily limited thereto, and a plurality of multiplexers MUX may be used.

The multiplexer MUX may include a plurality of thin film transistors formed through the same process as the driving circuit of the pixels PX, for example, a low temperature polycrystalline silicon (LTPS) process or a low temperature polycrystalline oxide (LTPO) process.

The sensing channels SCH connected to the output terminal of the multiplexer MUX may be connected to the touch signal pads TS-PD.

Figure 9A:
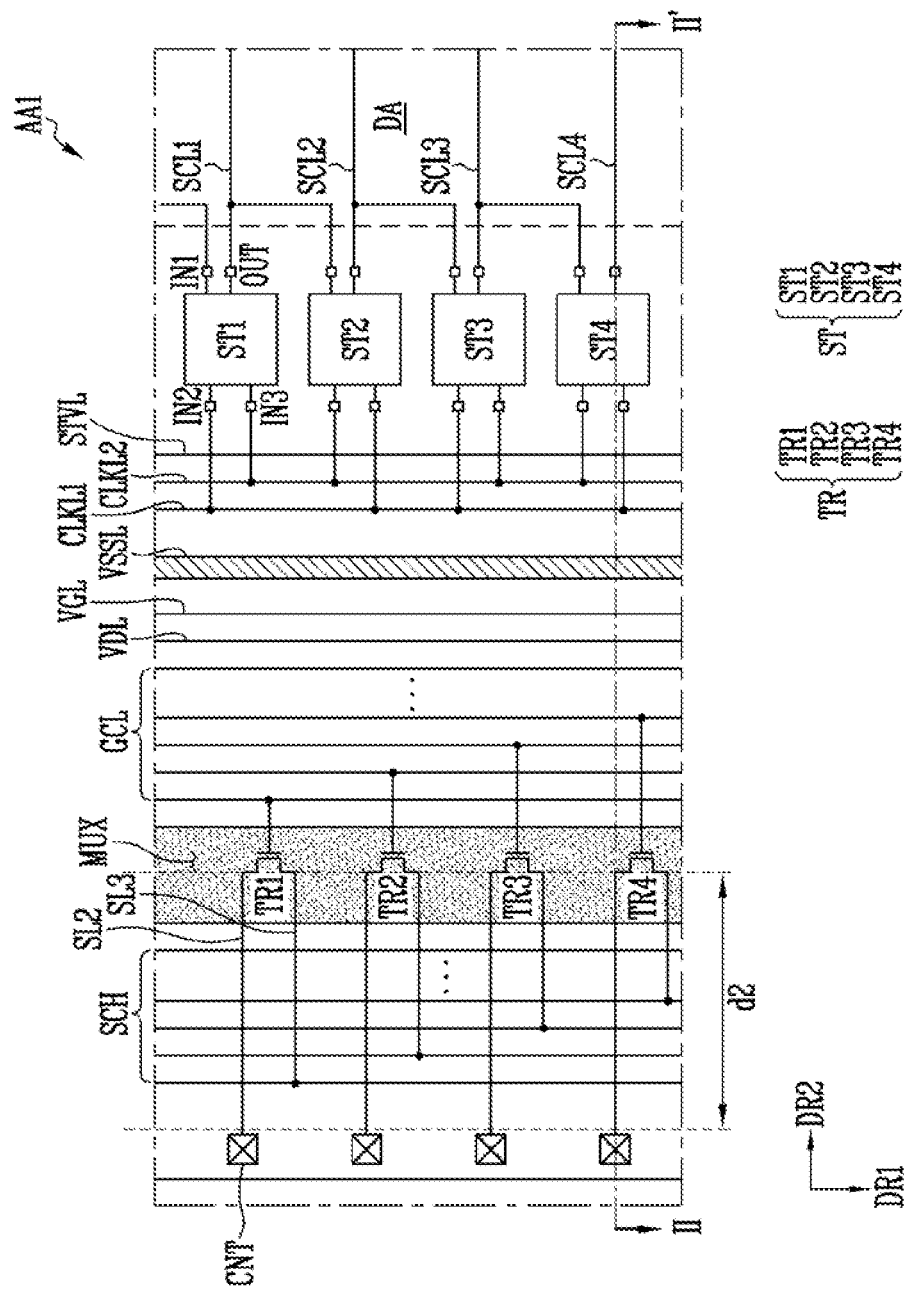
FIG. 9A is a plan view illustrating an enlarged area AA1 of FIG. 3.
Figure 10A:
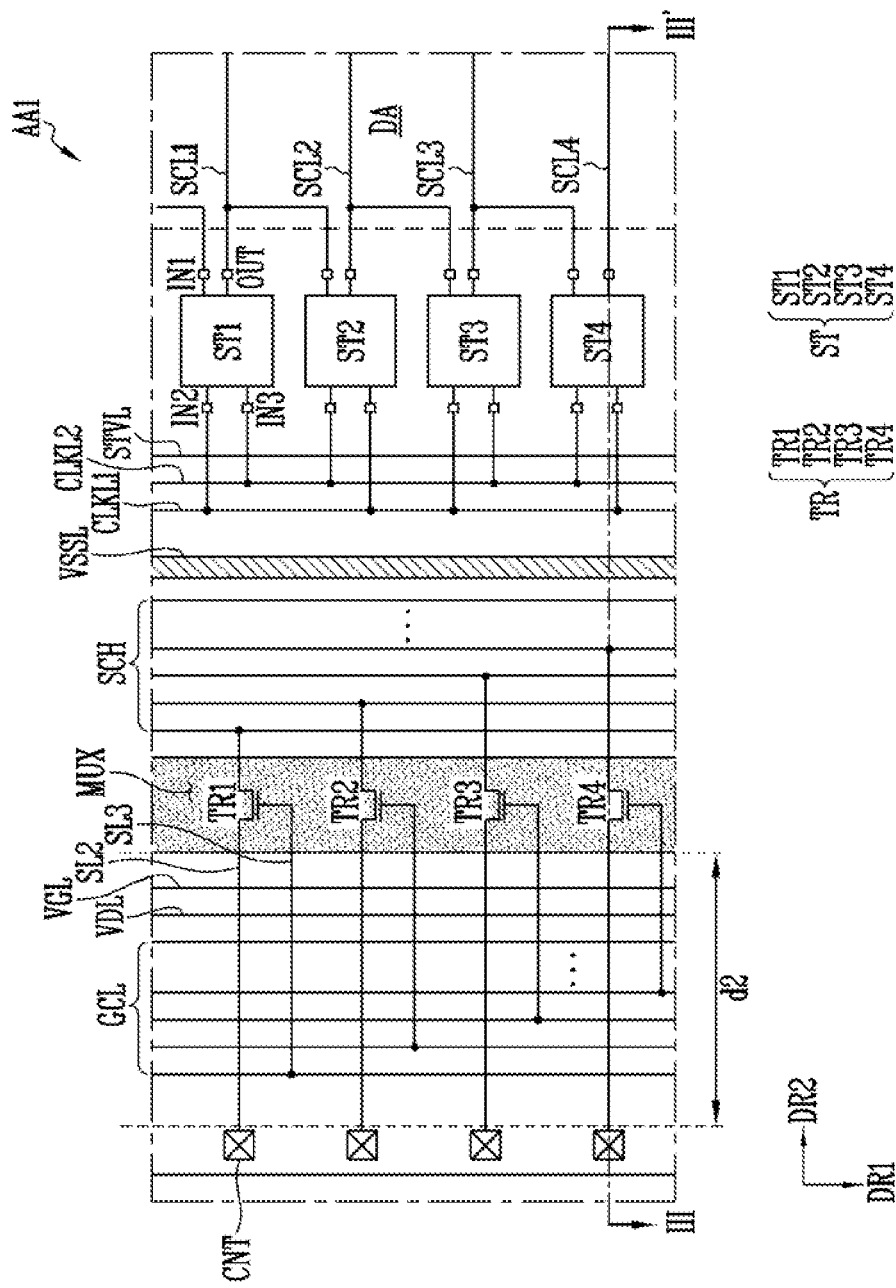
FIG. 10A is an enlarged plan view illustrating one area of a scan driver of a display panel according to an embodiment of the present invention.
Figure 11A:
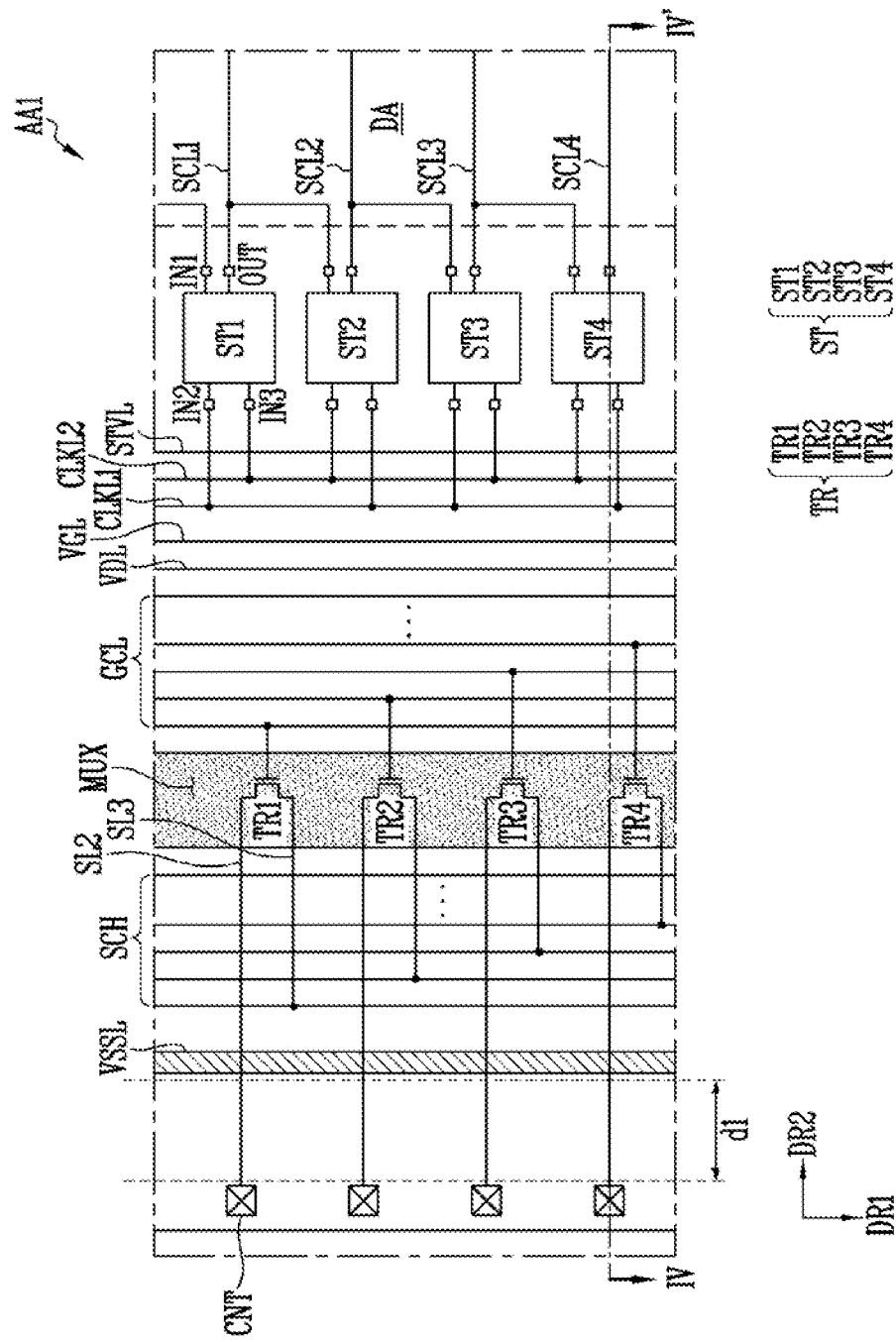
FIG. 11A is an enlarged plan view illustrating one area of a scan driver of a display panel according to an embodiment of the present invention.

As shown in FIGS. 9A, 10A, and 11A, gate control lines GCL for controlling switching elements (or thin film transistors) included in the multiplexer MUX, and a touch driving voltage line VDL and a touch ground voltage line VGL used for driving the touch sensing unit TS may be in a peripheral area of the multiplexer MUX.

FIG. 4 exemplarily illustrates a pixel PX connected to one scan line SCL, one data line DL, and one power line PL. The configuration of the pixel PX is not necessarily limited thereto and may be modified to achieve a desired implementation.

The pixel PX may include a light-emitting element LD and a pixel driving circuit PXC for driving the light-emitting element LD. The light-emitting element LD may be a top emission type diode or a bottom emission type diode. The pixel driving circuit PXC may include a first transistor T1 (or a switching transistor), a second transistor T2 (or a driving transistor), and a capacitor Cst. The first power voltage VDD may be provided to the second transistor T2, and the second power voltage VSS may be provided to the light-emitting element LD. The second power voltage VSS may be a voltage lower than the first power voltage VDD.

The first transistor T1 may output a data signal applied to the data line DL in response to a scan signal applied to the scan line SCL. The capacitor Cst may charge a voltage corresponding to a data signal received from the first transistor T1.

The second transistor T2 may be connected to the light-emitting element LD. The second transistor T2 may control a driving current flowing through the light-emitting element LD in response to an amount of charge stored in the capacitor Cst. The light-emitting element LD may emit light during a turn-on period of the second transistor T2.

The display panel DP may include a dam unit. The dam unit may extend along the edge of the display area DA. The dam unit may at least partially surround the display area DA.

Figure 5:
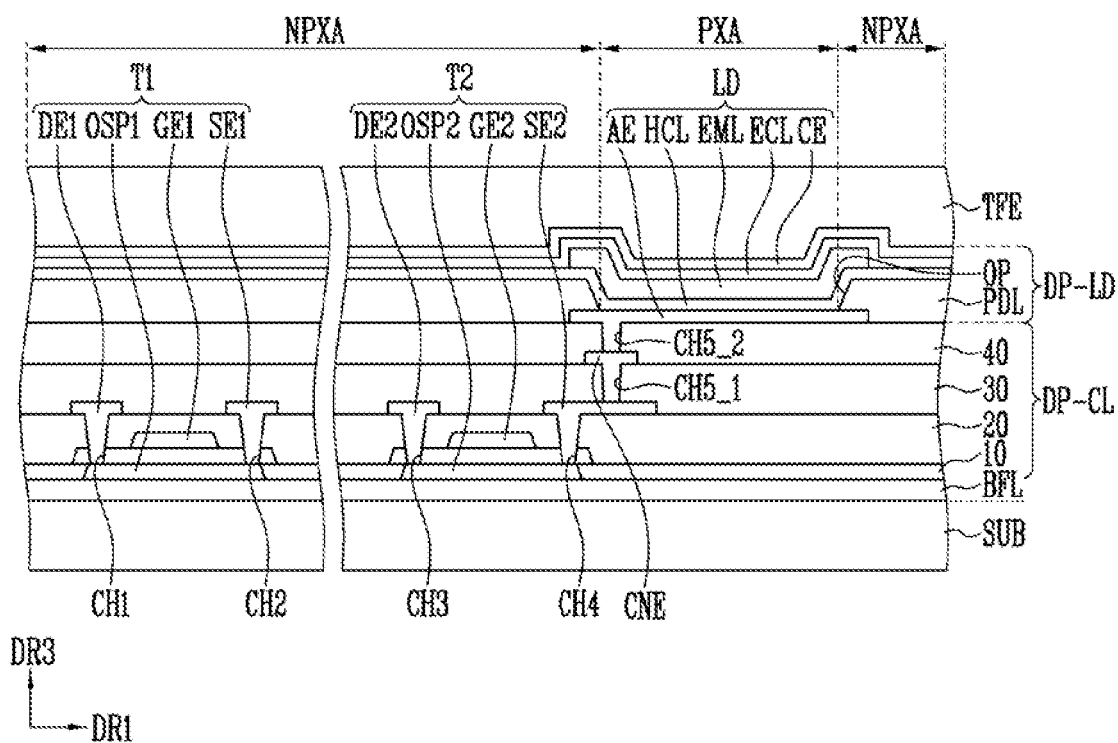
FIG. 5 is a cross-sectional view illustrating a portion of a display panel corresponding to an equivalent circuit shown in FIG. 4.

FIG. 5 is a cross-sectional view illustrating a portion of a display panel corresponding to an equivalent circuit shown in FIG. 4. In this case, the circuit element layer DP-CL, the display element layer DP-LD, and the thin film encapsulation layer TFE may be sequentially disposed on the base layer SUB.

The circuit element layer DP-CL may include at least one inorganic layer, at least one organic layer, and a circuit element. The circuit element layer DP-CL may include a buffer layer BFL, a first intermediate inorganic layer 10, and a second intermediate inorganic layer 20, which is an inorganic layer, and may include a first intermediate organic layer 30 and a second intermediate organic layer 40, which is an organic layer.

The inorganic layer may have a single layer or a multi-layer structure including silicon nitride, silicon oxy nitride, silicon oxide, and the like. The organic layer may include acryl-based resin, methacryl-based resin, polyisoprene, vinyl-based resin, epoxy-based resin, urethane-based resin, cellulose-based resin, siloxane-based resin, polyimide-based resin, polyamide-based resin, and/or perylene-based resin. The circuit element may include conductive patterns and/or semiconductor patterns.

The buffer layer BFL may increase bonding strength between the base layer SUB and the conductive patterns or semiconductor patterns. A barrier layer that prevents foreign substances from entering may be further disposed on an upper surface of the base layer SUB. The buffer layer BFL and the barrier layer may be selectively disposed and/or omitted.

A semiconductor pattern OSP1 (hereinafter, a first semiconductor pattern) of the first transistor T1 and a semiconductor pattern OSP2 (hereinafter, a second semiconductor pattern) of the second transistor T2 may be disposed on the buffer layer BFL. The first semiconductor pattern OSP1 and the second semiconductor pattern OSP2 may be formed of amorphous silicon, polysilicon, and/or metal oxide semiconductors.

The first intermediate inorganic layer 10 may be disposed on the first semiconductor pattern OSP1 and the second semiconductor pattern OSP2. A control electrode of the first transistor T1 (hereinafter, a first control electrode GE1) and a control electrode of the second transistor T2 (hereinafter, a second control electrode GE2) may be disposed on the first intermediate inorganic layer 10. The first control electrode GE1 and the second control electrode GE2 may be manufactured according to the same photolithography process as the scan lines SCL (refer to FIG. 5A).

A second intermediate inorganic layer 20 covering the first control electrode GE1 and the second control electrode GE2 may be disposed on the first intermediate inorganic layer 10. An input electrode (hereinafter, a first input electrode DE1) and an output electrode (hereinafter, a first output electrode SE1) of the first transistor T1, and an input electrode (hereinafter, a second input electrode DE2) and an output electrode (hereinafter, a second output electrode SE2) of the second transistor T2 may be disposed on the second intermediate inorganic layer 20.

The first input electrode DE1 and the first output electrode SE1 may be connected to the first semiconductor pattern OSP1 through a first contact hole CH1 and a second contact hole CH2 passing through the first intermediate inorganic layer 10 and the second intermediate inorganic layer 20, respectively. The second input electrode DE2 and the second output electrode SE2 may be connected to the second semiconductor pattern OSP2 through a third contact hole CH3 and a fourth contact hole CH4 passing through the first intermediate inorganic layer 10 and the second intermediate inorganic layer 20, respectively. Some of the first transistor T1 and the second transistor T2 may be transformed into a bottom gate structure.

The first intermediate organic layer 30 covering the first input electrode DE1, the second input electrode DE2, the first output electrode SE1 and the second output electrode SE2 may be disposed on the second intermediate inorganic layer 20. The first intermediate organic layer 30 may provide a flat surface. A connection electrode CNE connecting the second output electrode SE2 of the second transistor T2, and the first electrode AE may be disposed on the first intermediate organic layer 30. The connection electrode CNE may be connected to the second output electrode SE2 of the second transistor T2 through the 5_1-th contact hole CH5_1 penetrating the first intermediate organic layer 30. A second intermediate organic layer 40 covering the connection electrode CNE may be disposed on the first intermediate organic layer 30. The first and second intermediate organic layers 30 and 40 may each include organic insulating material such as general-purpose polymers such as polymethylmethacrylate or polystyrene, polymer derivatives having phenolic groups, acrylic polymers, imide polymers, arylether polymers, amide polymers, fluorine polymers, p-xylene polymers, vinyl alcohol polymers, and blends thereof. In an embodiment, the first and second intermediate organic layers 30 and 40 may each include polyimide.

A display element layer DP-LD may be disposed on the second intermediate organic layer 40. The display element layer DP-LD may include a pixel definition layer PDL and a light-emitting element LD. Like the second intermediate organic layer 40, the pixel definition layer PDL may include an organic material. The first electrode AE may be disposed on the second intermediate organic layer 40. The first electrode AE may be connected to the connection electrode CNE through the 5_2-th contact hole CH5_2 penetrating the second intermediate organic layer 40. An opening OP may be defined in the pixel definition layer PDL. The opening OP of the pixel definition layer PDL may expose at least a portion of the first electrode AE.

The pixel PX may be disposed in a pixel area in a plan view. The pixel area may include a light-emitting area PXA and a non-light-emitting area NPXA adjacent to the light-emitting area PXA. The non-light-emitting area NPXA may at least partially surround the light-emitting area PXA. In the present embodiment, the light-emitting area PXA may be defined to correspond to a portion of area of the first electrode AE exposed by the opening OP.

A hole control layer HCL may be commonly disposed in the light-emitting area PXA and the non-light-emitting area NPXA. A common layer such as the hole control layer HCL may be formed in common in the plurality of pixels PX (refer to FIG. 3).

The emission layer EML may be disposed on the hole control layer HCL. The emission layer EML may be disposed in an area corresponding to the opening OP. For example, the emission layer EML may be formed separately on each of the plurality of pixels PX. The emission layer EML may include an organic material and/or an inorganic material. In the present embodiment, the patterned emission layer EML is illustrated as an example, but the emission layer EML may be commonly disposed on the plurality of pixels PX. In this case, the emission layer EML may generate white light. In addition, the emission layer EML may have a multilayer structure.

An electronic control layer ECL may be disposed on the emission layer EML. The electronic control layer ECL may be commonly formed in the plurality of pixels PX (refer to FIG. 3).

The second electrode CE may be disposed on the electronic control layer ECL. The second electrode CE may be commonly disposed on the plurality of pixels PX.

The thin film encapsulation layer TFE may be disposed on the second electrode CE. The thin film encapsulation layer TFE may be commonly disposed on the plurality of pixels PX. In the present embodiment, the thin film encapsulation layer TFE may directly cover the second electrode CE. In one embodiment of the present invention, a capping layer covering the second electrode CE may be further disposed between the thin film encapsulation layer TFE and the second electrode CE. In this case, the thin film encapsulation layer TFE may directly cover the capping layer.

Figure 6A:
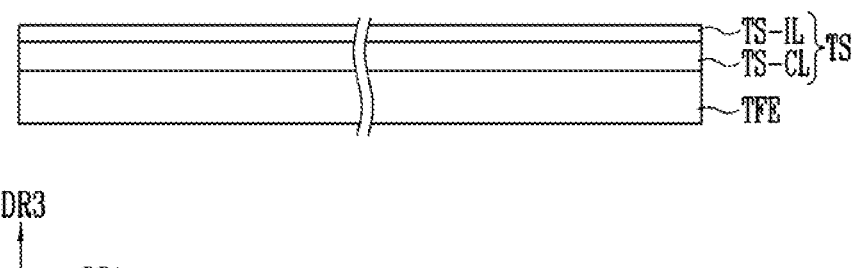
FIGS. 6A and 6B are cross-sectional and plan views, respectively, illustrating a touch sensing unit according to an embodiment of the present invention.
Figure 6B:
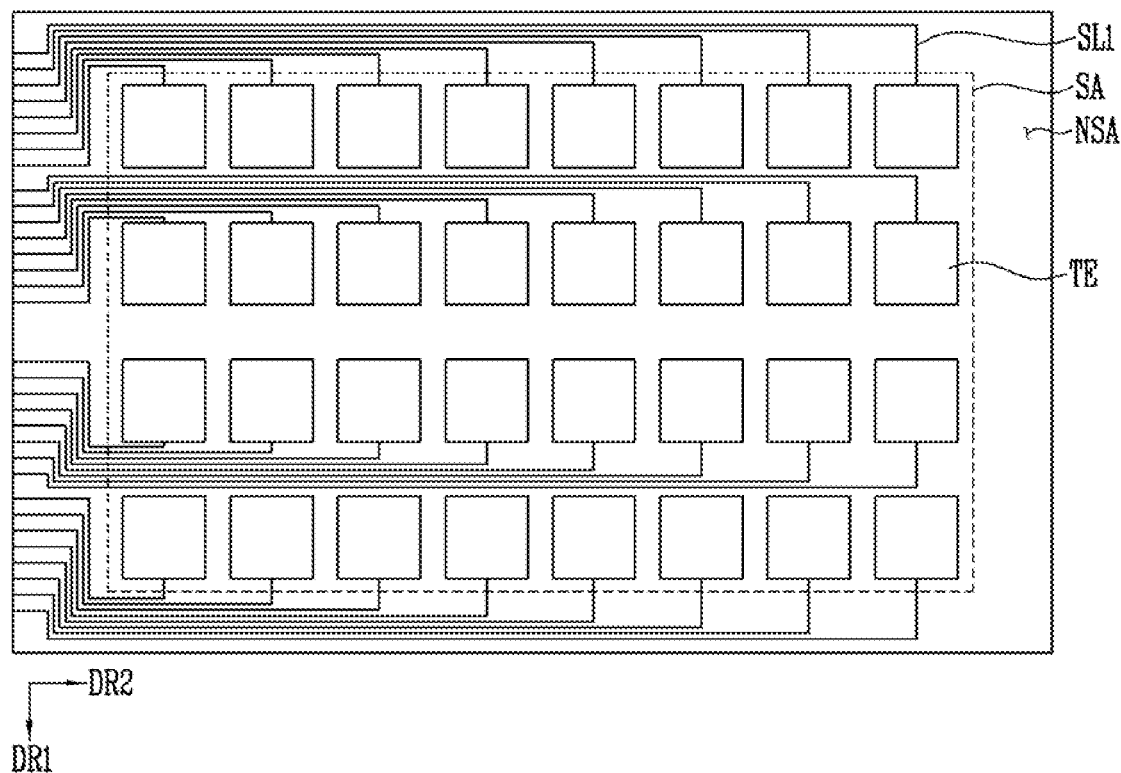

FIGS. 6A and 6B are cross-sectional and plan views, respectively, illustrating a touch sensing unit according to an embodiment of the present invention.

Referring to FIGS. 6A and 6B, the touch sensing unit TS, according to an embodiment of the present invention, may be a single-layered touch sensing unit including a conductive layer TS-CL and an insulating layer TS-IL (or, a touch insulating layer). The single-layered touch sensing unit TS may acquire coordinate information through a self-capacitance method. The conductive layer TS-CL may include a plurality of patterns such as touch electrodes and touch signal lines. The touch insulating layer TS-IL includes at least an inorganic layer. The touch insulating layer may further include an organic layer.

Figure 9B:
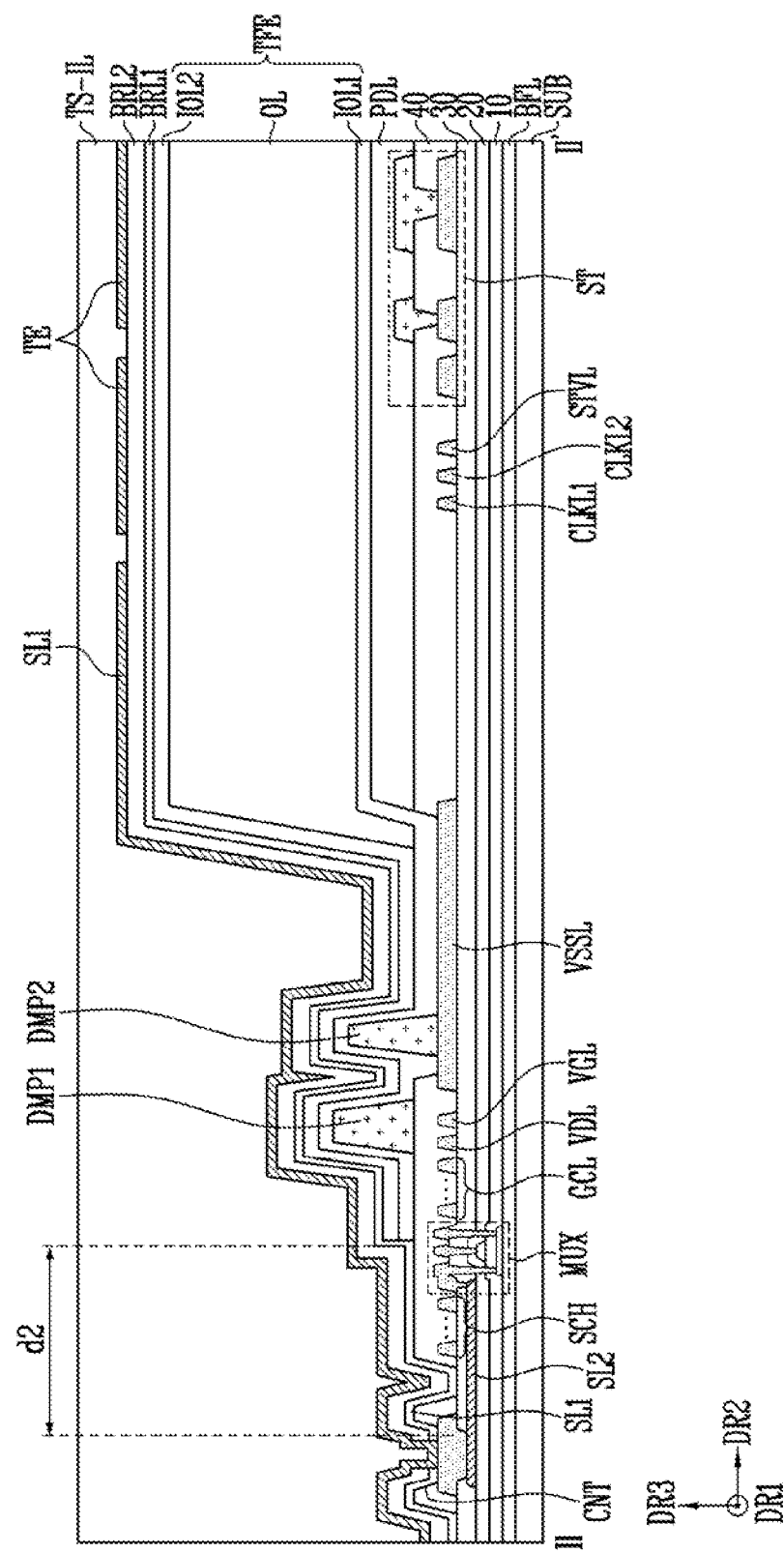
FIGS. 9B and 9C are cross-sectional views taken along a line II-II' of FIG. 9A.
Figure 10B:
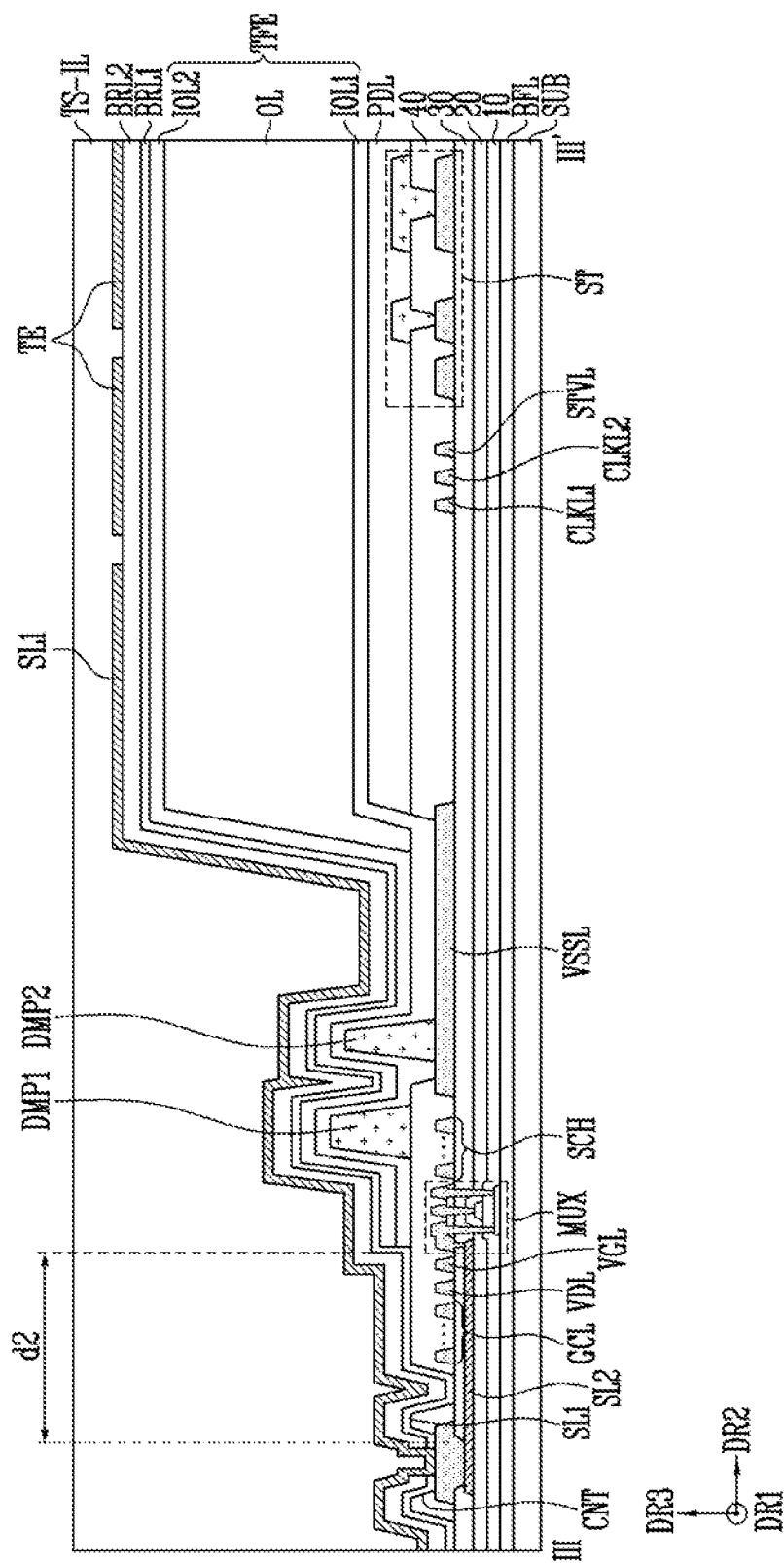
FIGS. 10B and 10C are cross-sectional views taken along a line III-III' of FIG. 10A.
Figure 11B:
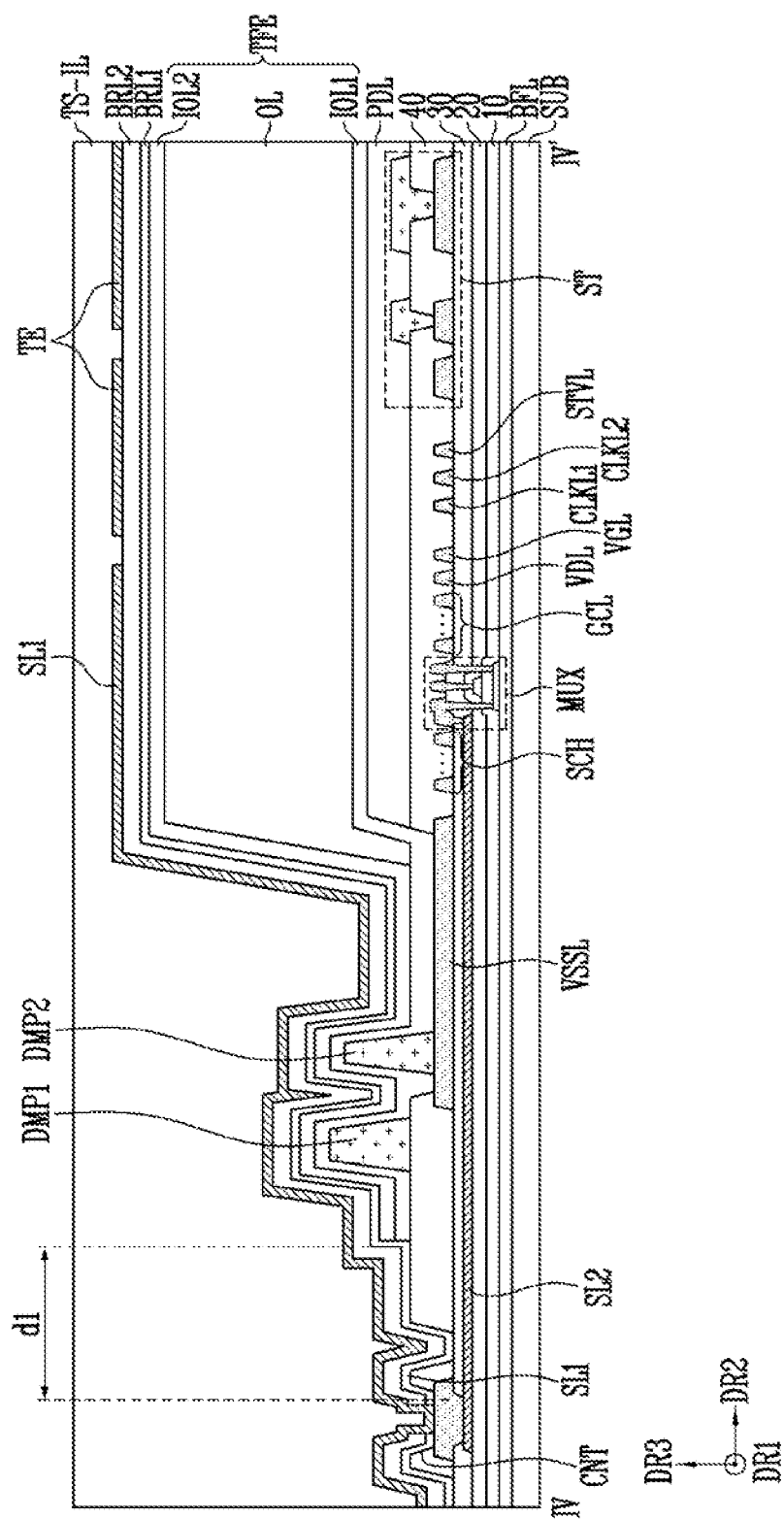
FIGS. 11B and 11C are cross-sectional views taken along a line IV-IV' of FIG. 11A.

Meanwhile, as shown in FIGS. 9B, 10B, and 11B, the touch sensing unit TS may further include a first barrier layer BRL1 and a second barrier layer BRL2 between the thin film encapsulation layer TFE and the conductive layer TS-CL. The first barrier layer BRL1 may be formed of an inorganic material. For example, the first barrier layer 120 may include a material containing silicon such as amorphous silicon (a-Si), silicon oxide (SiOx), silicon nitride (SiNx), and the like. The second barrier layer BRL2 may be formed of an inorganic material. The second barrier layer BRL2 may have the same material or the same thickness as the first barrier layer BRL1, but the present invention is not necessarily limited thereto, and the first barrier layer BRL1 and the second barrier layer BRL2 may have different materials and different thicknesses.

The touch sensing unit TS may include a sensing area SA capable of sensing a touch input, and a non-sensing area NSA surrounding at least a portion of the sensing area SA. According to an embodiment, the sensing area SA may be disposed to correspond to the display area DA of the display panel DP, and the non-sensing area NSA may be disposed to correspond to the non-display area NDA of the display panel DP. For example, the sensing area SA of the touch sensing unit TS may overlap the display area DA of the display panel DP in the third direction DR3, and the non-sensing area NSA of the touch sensing unit TS Silver may overlap the non-display area NDA of the display panel DP in the third direction DR3.

The touch sensing unit TS may include touch electrodes TE spaced apart from each other and first touch sensing lines SL1. According to an embodiment of the present invention, the touch electrodes TE may be arranged in a matrix pattern. The touch electrodes TE may have a quadrangle shape, but are not necessarily limited thereto. In some embodiments, the touch electrodes TE may have various shapes such as a polygonal shape, a circular shape, an oval shape, and the like. Also, in some embodiments, the touch electrodes TE may have two or more shapes. For example, some of the touch electrodes TE may have a quadrilateral shape, and others of the touch electrodes TE may have a circular shape.

The touch electrodes TE may be disposed in the form of islands spaced apart from each other along the first direction DR1 and the second direction DR2. The touch electrodes TE may form an electrode row in the second direction DR2 and may form an electrode row in the first direction DR1. In FIG. 6B, for convenience of description, the touch electrodes TE are illustrated in a 4×8 matrix. For example, it is shown that four touch electrodes TE are disposed in the first direction DR1 and eight touch electrodes TE are disposed in the second direction DR2. However, this is exemplary, and the number and arrangement of the touch electrodes TE may be variously changed.

The touch electrodes TE may be connected to one end of the first touch sensing lines SL1. The other end of the first touch sensing lines SL1 may be connected to the contact hole CNT shown in FIG. 3. The first touch sensing lines SL1 may be connected to the second touch sensing lines SL2 formed on the circuit element layer DP-CL through the contact hole CNT shown in FIG. 3. The second touch sensing lines SL2 may correspond to the first touch sensing lines SL1 formed on the thin film encapsulation layer TFE, respectively, and may transfer the sensing signals flowing through the first touch sensing lines SL1 to the input terminal of the multiplexer MUX.

Figure 7A:
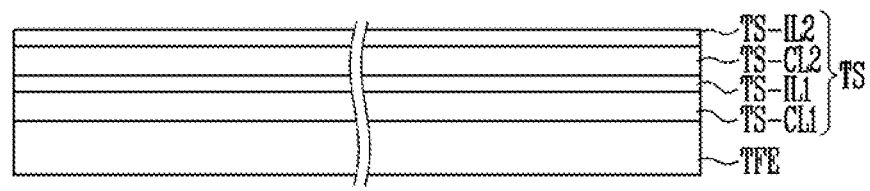
FIGS. 7A and 7B are cross-sectional and plan views, respectively, illustrating a touch sensing unit according to an embodiment of the present invention.
Figure 7B:
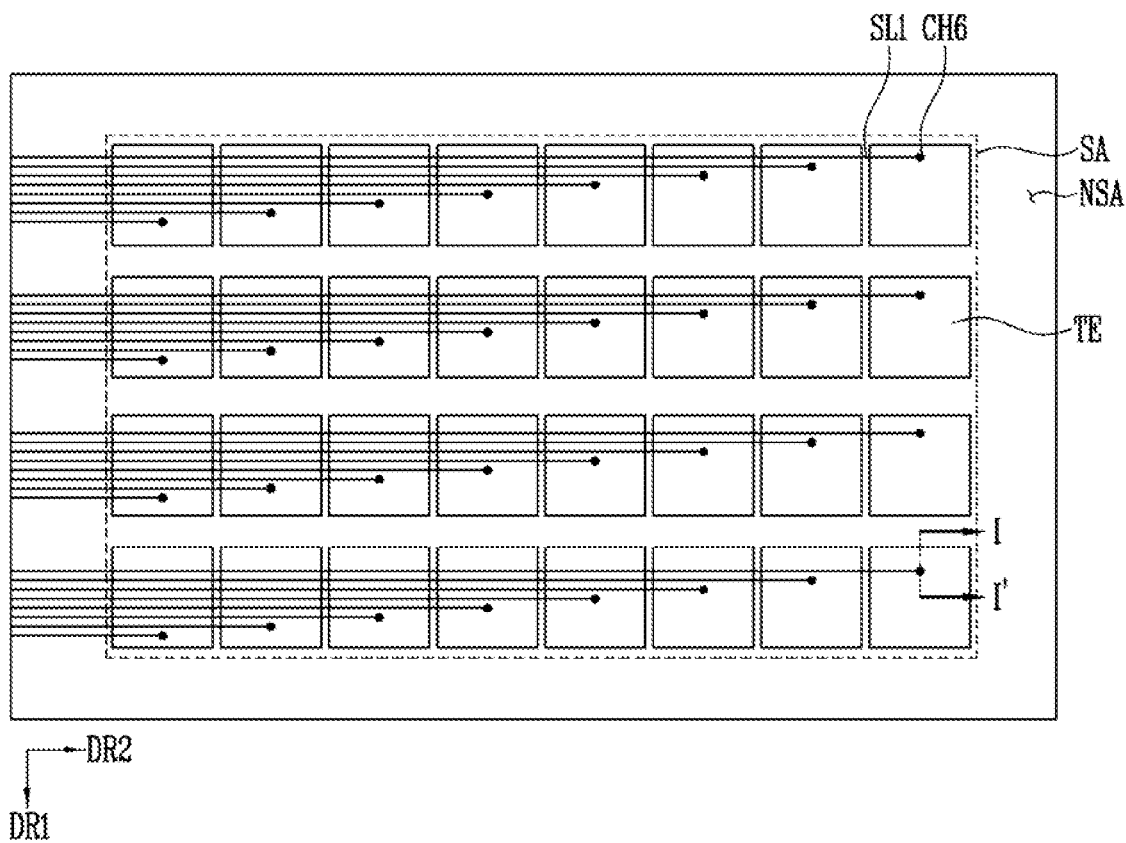
Figure 7C:
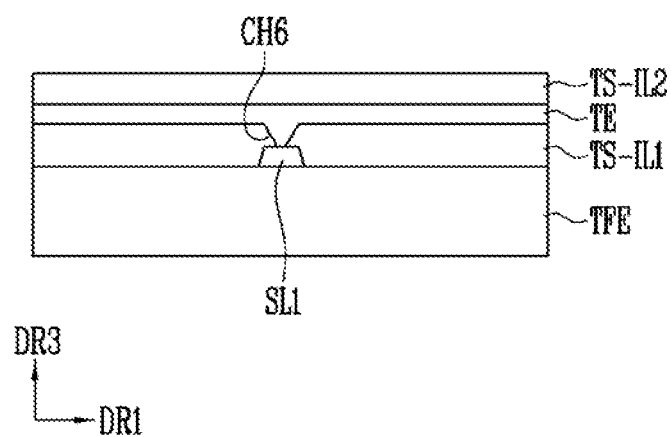
FIG. 7C is a cross-sectional view illustrating a touch sensing unit taken along a line II' of FIG. 7B.

FIGS. 7A and 7B are cross-sectional and plan views, respectively, illustrating a touch sensing unit according to an embodiment of the present invention. FIG. 7C is a cross-sectional view illustrating a touch sensing unit taken along a line II' of FIG. 7B.

The embodiments of the touch sensing unit TS shown in FIGS. 7A and 7B may be different from the arrangements illustrated in FIGS. 6a and 6b in which the first touch sensing lines SL1 are formed on the same conductive layer as the touch electrodes TE, in that the first touch sensing lines SL1 are formed on a conductive layer different from the touch electrodes TE. Hereinafter, to the extent that a detailed description of an element has been omitted, it may be assumed that this element is at least similar to corresponding elements that are described elsewhere in the Specification.

For example, referring to FIG. 7A, the touch sensing unit TS may include a first conductive layer TS-CL1, a first insulating layer TS-IL1 (hereinafter, a first touch insulating layer), a second conductive layer TS-CL2, and a second insulating layer TS-IL2 (hereinafter, a second touch insulating layer). The first conductive layer TS-CL1 may be disposed directly on the thin film encapsulation layer TFE. The present invention is not necessarily limited thereto, and another inorganic or organic layer may be further disposed between the first conductive layer TS-CL1 and the thin film encapsulation layer TFE.

As shown in FIG. 7B, the touch sensing unit TS may include a sensing area SA capable of sensing a touch input and a non-sensing area NSA surrounding at least a portion of the sensing area SA. The touch sensing unit TS may include touch electrodes TE disposed to be spaced apart from each other and first touch sensing lines SL1. According to an embodiment of the present invention, the touch electrodes TE may be arranged in a matrix pattern.

The first touch sensing lines SL1, according to an embodiment, may extend in the second direction DR2 and may be arranged in the first direction DR1. One end of the first touch sensing lines SL1 may be connected to the touch electrodes TE, and the other end thereof may be connected to the second touch sensing lines SL2 through the touch contact hole CNT.

An area of the touch electrodes TE shown in FIG. 7B may be larger than an area of the touch electrodes TE shown in FIG. 6B. For example, since the first touch sensing lines SL1 are formed on a different layer from the touch electrodes TE, they may overlap each other in the third direction DR3. Accordingly, the areas of the touch electrodes TE can be made larger, thereby enhancing the touch sensing performance.

Referring to FIG. 7C, the first conductive layer TS-CL1 may include the first touch sensing lines SL1, and the second conductive layer TS-CL2 may include the touch electrodes TE. The touch electrodes TE may be electrically connected to the first touch sensing lines SL1 through a sixth contact hole CH6 penetrating the first touch insulating layer TS-ILL FIG. 8 is a schematic diagram illustrating a circuit diagram for touch detection according to an embodiment of the present invention.

Figure 8:
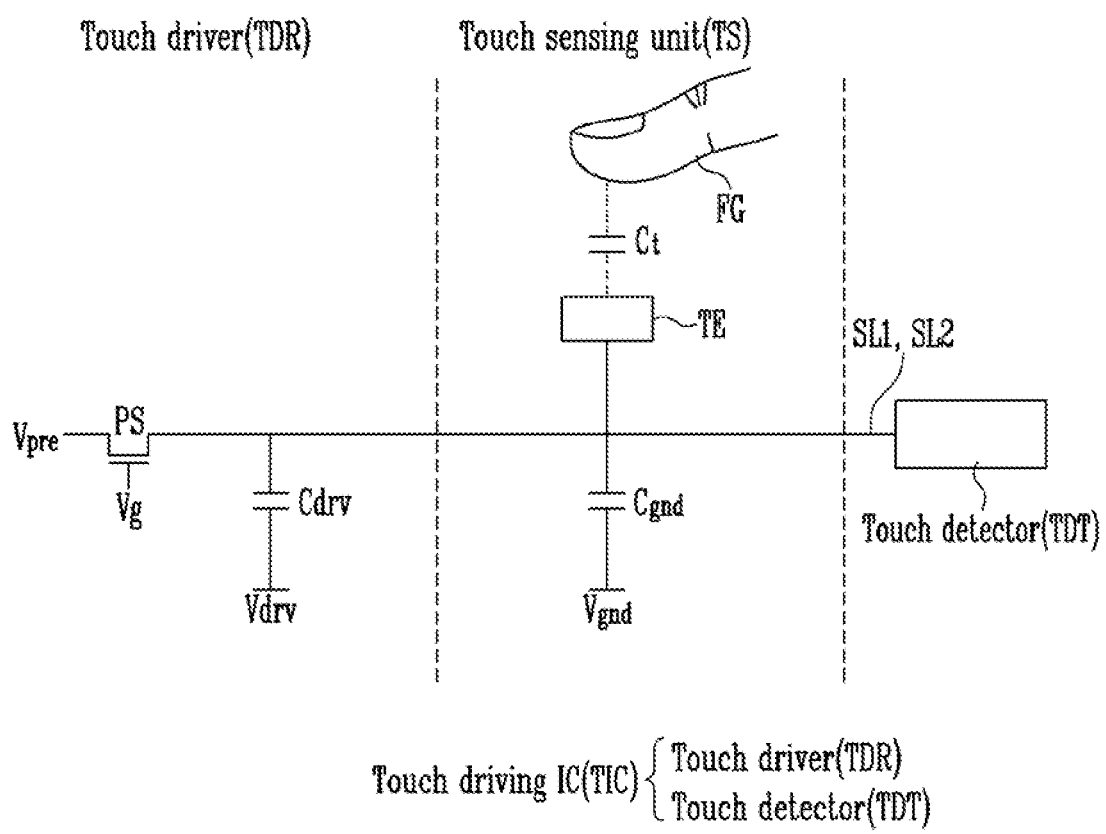
FIG. 8 is a schematic circuit diagram illustrating touch detection according to an embodiment of the present invention.

Referring to FIG. 8, the touch driving IC TIC may include a touch driver TDR and a touch detector TDT. The touch driver TDR may supply a driving signal to the touch sensing unit TS (or the touch electrode TE), and may detect a touch position by receiving a sense signal corresponding to the driving signal from the touch sensing unit TS (or the touch electrode TE).

The precharging switching element PS of the touch driver TDR may apply a precharge voltage Vpre to the touch electrode TE in response to the switching signal Vg. The touch sensing unit TS of the present invention may include a driving voltage generator in the touch driver TDR to enhance touch sensitivity. When detecting a touch, the driving voltage generator may apply a touch driving voltage Vdrv to a driving capacitor Cdrv.

When a finger FG touches the touch sensing unit TS (or the touch electrode TE), a contact capacitive capacitance Ct may be generated. A cover window may be disposed on the touch electrode TE, and when the cover window overlapping the touch electrode TE in the thickness direction is touched with a finger FG, the contact capacitive capacitance Ct may be generated.

Depending on a voltage value applied to a common driving electrode, a value of the capacitive capacitance formed between the touch electrode TE and the finger may change. The touch electrodes TE may overlap at least one electrode provided in the display panel DP. For example, when the display panel DP is an organic light-emitting diode display panel, the touch electrodes TE may overlap a cathode electrode CE (refer to FIG. 5) of the display panel DP. According to an embodiment, the cathode electrode CE of the display panel DP may function as a common driving electrode.

Depending on a touch ground voltage Vgnd applied to the common driving electrode, A value Cgnd of the capacitive capacitance formed between the touch electrode TE and the common driving electrode may change.

When the driving voltage Vdrv is applied to the driving capacitor Cdrv, the touch detector TDT of the present embodiment may determine whether a contact or non-contact touch is performed by the touch input means (e.g., finger FG) of the touch electrode TE based on a voltage difference between when the contact capacitive capacitance Ct is generated and when the contact capacitive capacitance Ct is not generated.

For example, when the user's finger FG contacts at least one of the touch electrodes TE, the contact capacitive capacitance Ct may be generated between the finger FG and the touch electrodes TE, the value Cgnd of the capacitive capacitance may be changed by the contact capacitive capacitance Ct. The value Cgnd of the changed capacitive capacitance may be transferred to the touch detector TDT through the touch sensing lines SL1 and SL2 connected to the touch electrodes TE which the finger FG contacts. The touch detector TDT may detect a touch position by checking the touch sensing lines SL1 and SL2 receiving the value Cgnd of the changed capacitive capacitance. For example, the touch detector TDT may detect the touch position by detecting a change amount of self-capacitance formed in the touch electrode TE.

When signal lines are disposed adjacent to each other, crosstalk between the signal lines may increase, and thus signal integrity may be deteriorated. Conventionally, the sensing channels SCH output from the multiplexer MUX are disposed adjacent to the scan control lines CSL, but the crosstalk occurs from the first and second clock signals CLK1 and CLK2 and/or the scan start signal STV, and the like transferred through the scan control lines CSL, resulting in the quality of the sensing signals of the sensing channels SCH being deteriorated.

To prevent noise from being introduced into the sensing signals transmitted through the sensing channels SCH, the sensing channels SCH and the scan control lines CSL are spaced apart from each other. However, in terms of process efficiency, the scan driver SDC and the multiplexer MUX maybe formed substantially simultaneously through the same process as a process forming a driving circuit of the pixels PX, for example, a low temperature polycrystalline silicon (LTPS) process or a low temperature polycrystalline oxide (LTPO) process. Accordingly, various embodiments in which the sensing channels SCH and the scan control lines CSL are separated from each other in a plan view (or in the first direction DR1 and in the second direction DR) will be described.

Figure 9C:
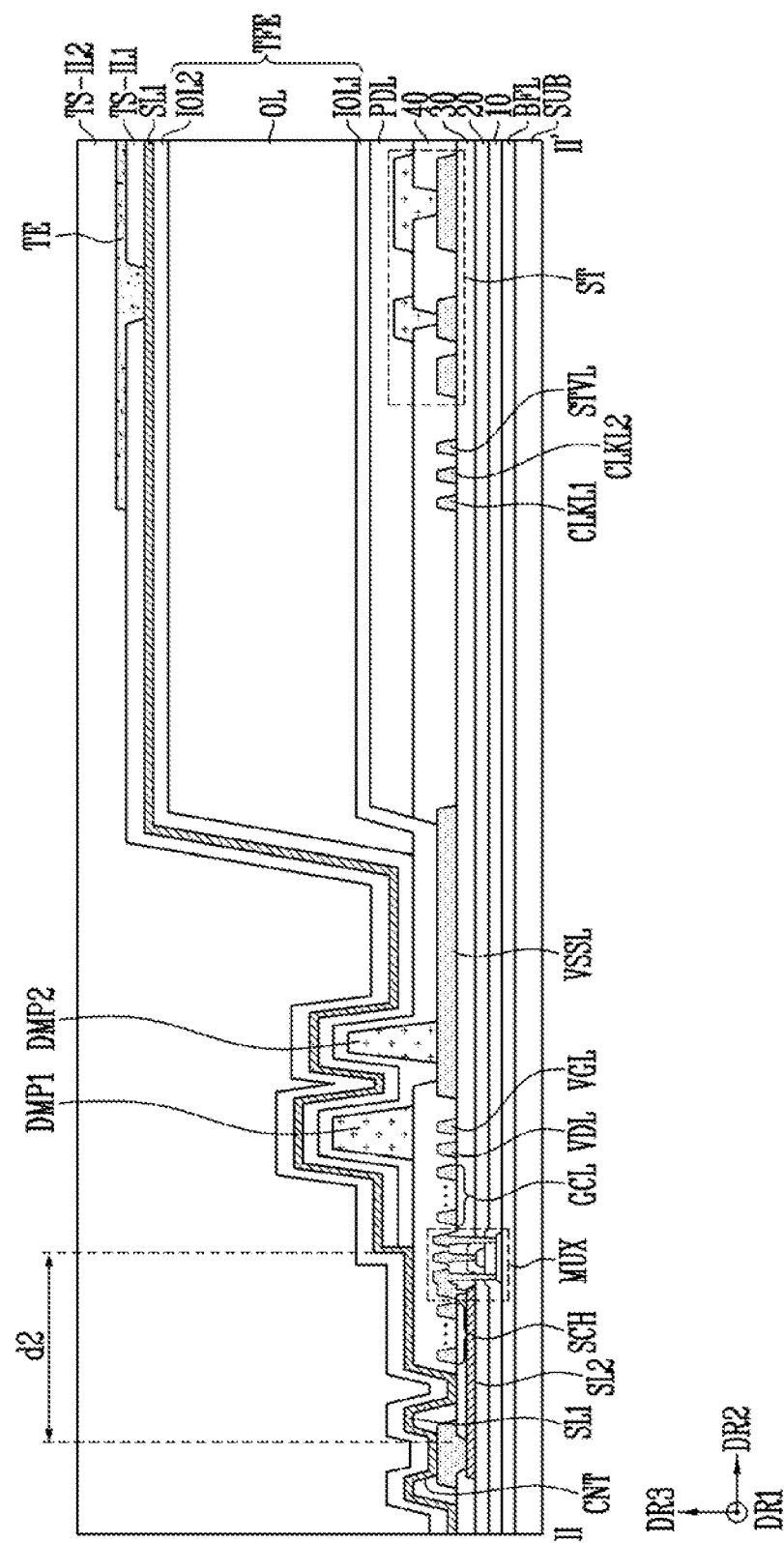

FIG. 9A is a plan view illustrating an enlarged area AA1 of FIG. 3. FIGS. 9B and 9C are cross-sectional views taken along a line II-IT of FIG. 9A. In this case, FIG. 9B is a cross-sectional view corresponding to the arrangement illustrated in FIGS. 6A and 6B, and FIG. 9C is a cross-sectional view corresponding to the arrangement illustrated in FIGS. 7A to 7C.

Referring to FIGS. 3, 9A, 9B, and 9C, in the display panel DP according to an embodiment of the present invention, the scan driver SDC, the second power voltage line VSSL, the multiplexer MUX, and the touch contact holes CNT may be sequentially disposed from the display area DA to one end direction of the display panel DP (e.g., the left end direction).

The scan driver SD may include a plurality of stages ST. In FIG. 9, for convenience of description, four stages ST1, ST2, ST3, and ST4 are illustrated.

The scan driver SD, according to an embodiment of the present invention, may include first to fourth stages ST1 to ST4. One end of each of the first to fourth stages ST1 to ST4 may be connected to one of the first to fourth scan lines SCL1 to SCL4, and the other end of each of the first to fourth stages ST1 to ST4 may be connected to the first and second clock signal lines CLKL1 and CLKL2 supplying the first and second clock signals CLK1 and CLK2 and the scan start signal line STVL supplying the scan start signal STV. The first to fourth stages ST1 to ST4 may be configured with the same circuit as each other.

According to an embodiment, the first and second clock signal lines CLKL1 and CLKL2 and the scan start signal line STVL may be formed at a left side of the first to fourth stages ST1 to ST4. The first and second clock signal lines CLKL1 and CLKL2 and the scan start signal line STVL may extend in parallel to each other in the first direction DR1. Each of the first and second clock signal lines CLKL1 and CLKL2 and the scan start signal line STVL may be electrically connected to the touch signal pads TS_PD, and may receive the first and second clocks signals CLK1 and CLK2 and the scan start signal STV through the touch signal pads TS_PD.

Each of the first to fourth stages ST1 to ST4 may include a first input terminal IN1 to a third input terminal IN3 and an output terminal OUT.

The first input terminal IN1 of each of the stages ST1 to ST4 may receive an output signal (e.g., a driving signal) of the previous stage or the scan start signal STV. For example, the first input terminal IN1 of the first stage ST1 may receive the scan start signal STV, and the first input terminal IN1 of the other stages ST2 to ST4 may receive the output signal of the previous stage.

The second input terminal IN2 of the odd-numbered stage may receive the first clock signal CLK1, and the third input terminal IN3 thereof may receive the second clock signal CLK2. The second input terminal IN2 of the even-numbered stage may receive the second clock signal CLK2, and the third input terminal IN3 thereof may receive the first clock signal CLK1. However, the present invention is not necessarily limited thereto, and the clock signals CLK1 and CLK2 input to the odd-numbered stage and the even-numbered stage may be swapped for one another.

The first clock signal CLK1 and the second clock signal CLK2 may be signals that have the same cycle and do not overlap with each other in phase. For example, when a period in which a driving signal is supplied to one driving line is referred to as one horizontal period 1H, each of the clock signals CLK1 and CLK2 may have a cycle of 2H and may be supplied to different horizontal periods.

The multiplexer MUX may be disposed between the touch contact holes CNT and the scan driver SDC in a plan view.

The multiplexer MUX may include a plurality of switching elements (or a first transistor TR1, a second transistor TR2, a third transistor TR3, and a fourth transistor TR4). Since the first to fourth transistors TR1 to TR4 operate substantially the same, a description will be given below based on the first transistor TR1 and it may be assumed that this description applies equally to the other transistors.

The first transistor TR1 may be connected between the second touch sensing line SL2 and the third touch sensing line SL3. According to an embodiment, the first transistor TR1 may include a first electrode connected to the second touch sensing line SL2, a second electrode connected to the third touch sensing line SL3, and a gate electrode connected to a gate control line GCL.

One end of the third touch sensing line SL3 may be connected to the output terminal of the multiplexer MUX, and the other end thereof may be connected to the touch signal pads TS_PD (refer to FIG. 3). According to an embodiment, the second touch sensing line SL2 and the third touch sensing line SL3 may extend in parallel to each other in the second direction DR.

The first transistor TR1 may be turned on in response to a gate control signal supplied through the gate control lines GCL. The gate control lines GCL may be disposed at one side of the multiplexer MUX. For example, the gate control lines GCL may be disposed at the right side of the multiplexer MUX.

For example, the gate control lines GCL may be disposed between the multiplexer MUX and the scan driver SDC in a plan view. The gate control lines GCL may extend in the first direction DR1 and may be parallel to the first and second clock signal lines CLKL1 and CLKL2 and the scan start signal line STVL.

A touch driving voltage line VDL and a touch ground voltage line VGL may be disposed at one side of the gate control line GCL. For example, the touch driving voltage line VDL and the touch ground voltage line VGL may be sequentially disposed at the right side of the gate control line GCL.

The touch driving voltage Vdrv (refer to FIG. 8) may be supplied to the touch electrode TE through the touch driving voltage line VDL, and the touch ground voltage Vgnd may be supplied to at least one electrode (e.g., the cathode electrode CE, refer to FIG. 5) provided in the display panel DP through the touch ground voltage line VGL.

The sensing channels SCH for transferring the sensing signals received from the touch sensing unit TS to the touch signal pads TS_PD may be disposed at one side of the multiplexer MUX. For example, the sensing channels SCH may be disposed at the left side of the multiplexer MUX. Meanwhile, in FIG. 9A, each of the sensing channels SCH, the second touch sensing line SL2 and third touch sensing line SL3 are shown to be orthogonal to each other, but each of the sensing channels SCH and the second touch sensing line SL2 may be formed on a different layer of the circuit element layer DP-CL, and each of the sensing channels SCH and the third touch sensing line SL3 may be formed on a different layer of the circuit element layer DP-CL.

The second power voltage line VSSL may be disposed between the first clock signal line CLKL1 and the touch ground voltage line VGL. The second power voltage line VSSL may extend in the first direction DR1 and may be disposed in parallel with the first clock signal line CLKL1 and the touch ground voltage line VGL. The second power voltage VSS supplied through the second power voltage line VSSL may be a DC voltage.

According to experimental measurements, when the sensing channels SCH and the scan control lines CSL (refer to FIG. 3) (or first and second clock signals CLKL1 and CLKL2 and scan start signal line STV) is spaced apart from each other by more than a certain distance, it is confirmed that noise inflow is reduced. For example, when the distance between the sensing channels SCH and the scan control lines CSL is separated by about 300 μm or more, the noise inflow is reduced to an acceptable level, and when the distance is separated by about 348 μm or more, the noise inflow may rarely occur.

According to an embodiment of the present invention, the multiplexer MUX, the gate control lines GCL, the touch driving voltage line VDL, the ground voltage line VGL and the second power supply voltage line VSSL may be disposed between the sensing channels SCH and the scan control lines CSL, thereby preventing noise that may be introduced from the first and second clock signals CLKL1 and CLKL2 and the scan start signal line STV. In particular, the second power voltage VSS supplied through the second power voltage line VSSL is a DC voltage and has excellent noise shielding characteristics.

Meanwhile, instead of spacing the sensing channels SCH apart from the scan control lines CSL (or the first and second clock signals CLKL1 and CLKL2 and the scan start signal line STV) for noise shielding, circuits and signal lines (e.g., the multiplexer MUX, the gate control lines GCL, the touch driving voltage line VDL, the ground voltage line VGL, and the second power voltage line VSSL, and the like) used to drive the display device DD may be disposed therebetween, thereby not only shielding noise but also reducing an area of dead space.

Referring to FIGS. 9B and 9C, the thin film encapsulation layer TFE may cover the second power voltage line VSSL. In this case, the thin film encapsulation layer TFE may include a first inorganic layer IOL1, an organic layer OL, and a second inorganic layer IOL2.

According to an embodiment, the display panel DP (refer to FIG. 3) may include first and second dam units DMP1 and DMP2. The first and second dam units DMP1 and DMP2 may extend along the edge of the display area DA. The dam unit DMP may at least partially surround the display area DA. For example, the first dam unit DMP1 may overlap the touch driving voltage line VDL and the ground voltage line VGL in the thickness direction (or the third direction DR3), and the second dam unit DMP2 may overlap the second power voltage line VSSL in the thickness direction (or the third direction DR3). One end of the thin film encapsulation layer TFE may overlap the multiplexer MUX in the thickness direction (or the third direction DR3).

When the touch contact hole CNT and the second power voltage line VSSL are adjacent to each other, the touch contact hole CNT may be blocked in the process of sealing the second power voltage line VSSL with the thin film encapsulation layer TFE. To prevent the touch contact hole CNT from being blocked, one end of the thin film encapsulation layer TFE from is separated from the touch contact hole CNT by a first distance d1 (refer to FIGS. 11A, 11B and 11C). For example, the first distance d1 from the touch contact hole CNT to one end of the thin film encapsulation layer TFE may be about 100 μm. When the touch contact hole CNT is larger in consideration of a process margin in addition to the first distance d1, it may cause an increase in dead space.

Figure 11C:
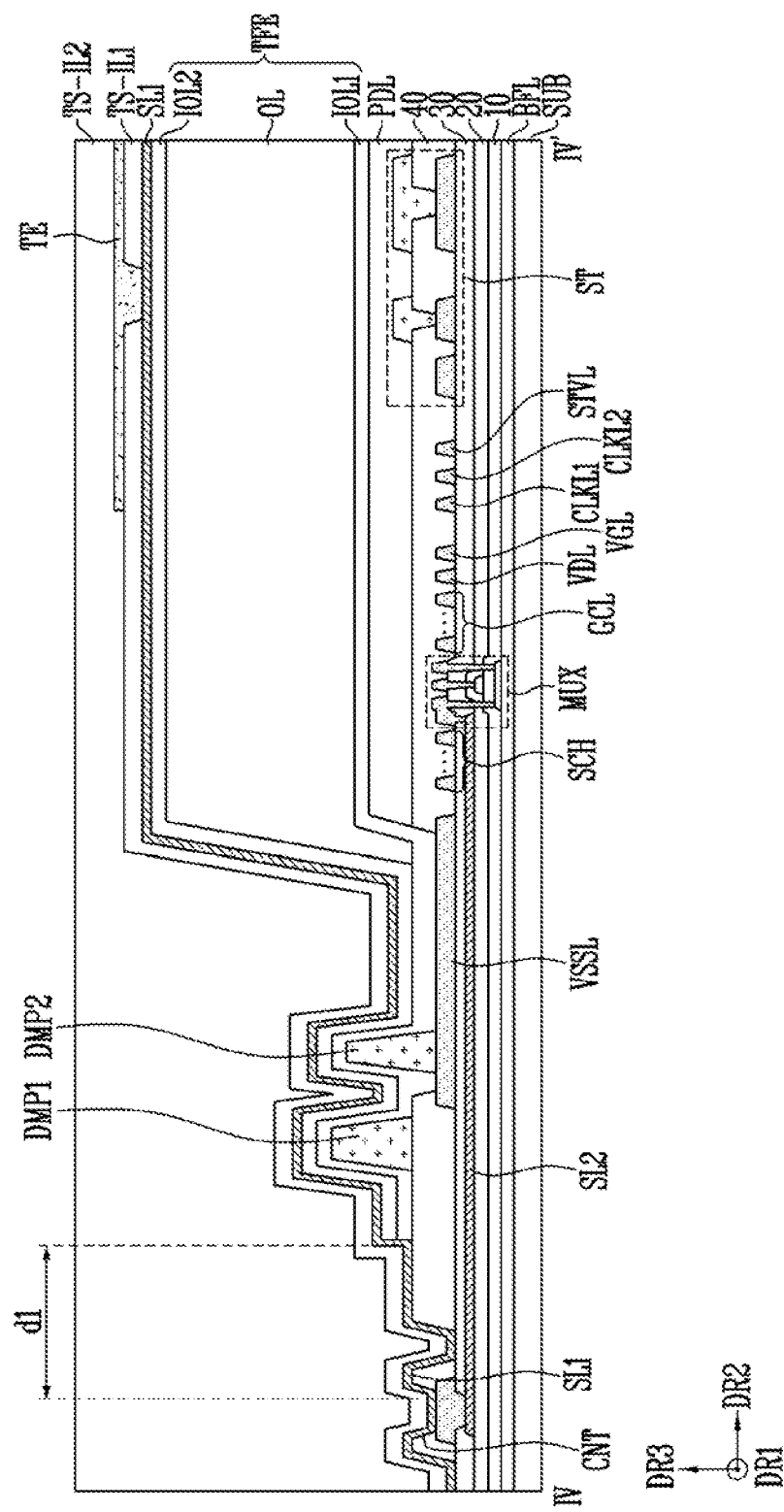

As shown in FIGS. 9B and 9C, according to an embodiment of the present invention, a second distance d2 from the touch contact hole CNT to one end of the thin film encapsulation layer TFE may be greater than the first distance d1 (refer to FIGS. 11A and 11C). For example, the sensing channels SCH, the multiplexer MUX, the gate control lines GCL, the touch driving voltage line VDL, and the ground voltage line VGL may be disposed between the touch contact hole CNT and the second power voltage line VSSL, thereby securing a sufficient separation distance between the touch contact hole CNT and the second power voltage line VSSL. In this case, since a separation distance greater than or equal to the first distance d1 already exists between the touch contact hole CNT and one end of the thin film encapsulation layer TFE, there is no need to provide an additional empty space equal to the first distance d1 from the touch contact hole CNT to one end of the thin film encapsulation layer TFE. In addition, in this case, since the probability that the touch contact hole CNT is blocked by the thin film encapsulation layer TFE is low, the touch contact hole CNT may be formed smaller than a case that the touch contact hole CNT and the second power voltage line VSSL are adjacent to each other, thereby reducing an area of the dead space.

Hereinafter, to the extent that a detailed description of an element has been omitted, it may be assumed that this element is at least similar to corresponding elements that are described elsewhere in the Specification.

Figure 10C:
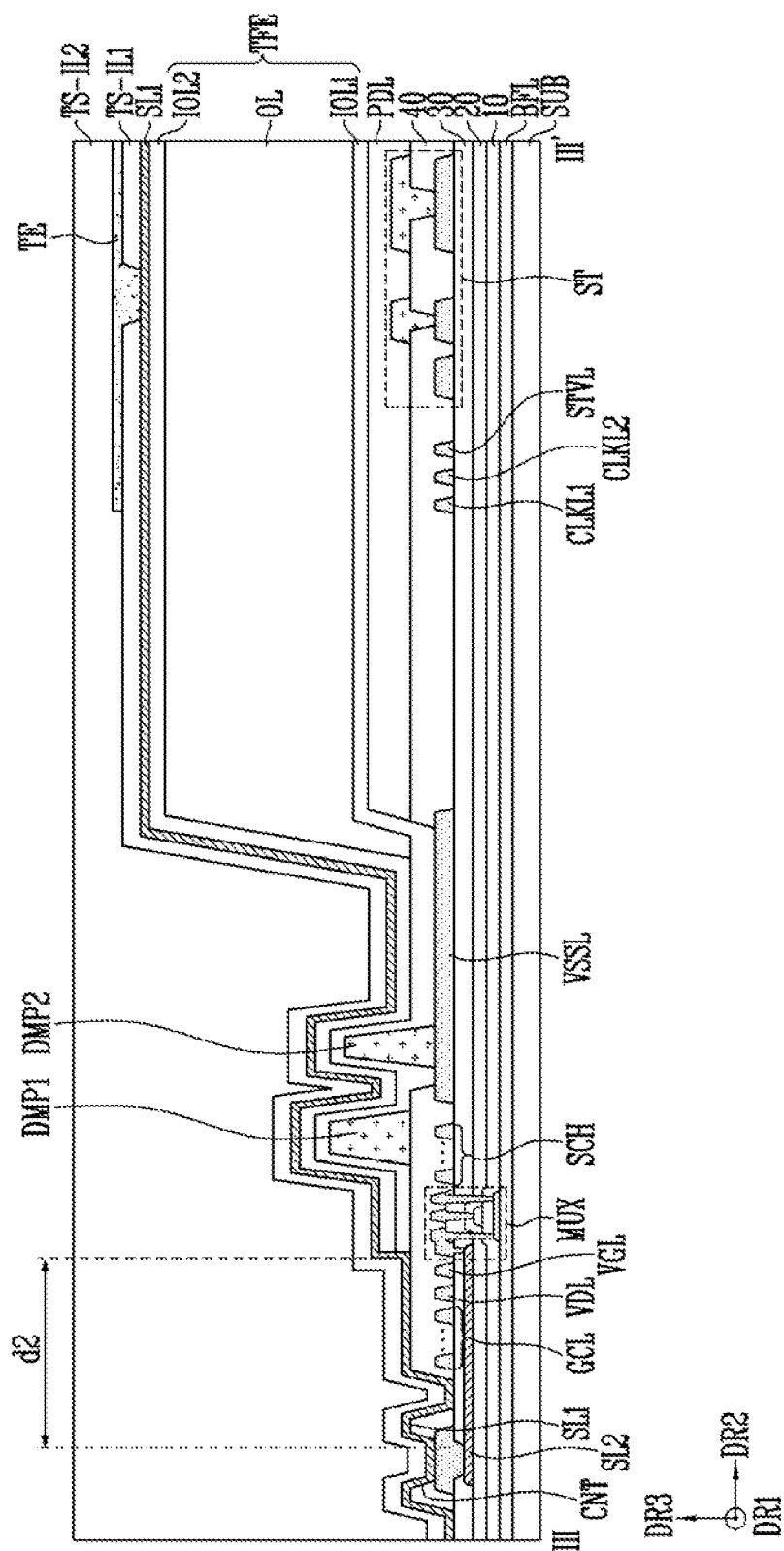

FIG. 10A is an enlarged plan view illustrating one area of a scan driver of a display panel according to an embodiment of the present invention. FIGS. 10B and 10C are cross-sectional views taken along a line III-III' of FIG. 10A. In this case, FIG. 10B is a cross-sectional view corresponding to the arrangement illustrated in FIGS. 6A and 6B, and FIG. 10C is a cross-sectional view corresponding to the arrangement illustrated in FIGS. 7A to 7C.

The arrangement illustrated in FIGS. 10A, 10B, and 10C may be different from the arrangement illustrated in FIGS. 9A, 9B and 9C in which the sensing channels SCH are disposed at the left side and the gate control lines GCL, the touch driving voltage line VDL, and the ground voltage line VGL are disposed at the right side with respect to the multiplexer MUX, in that the gate control lines GCL, the touch driving voltage line VDL, and the ground voltage line VGL are disposed on the left side and the sensing channels SCH are disposed at the right side with respect to the multiplexer MUX.

According to an embodiment, the sensing channels SCH and the gate control lines GCL may be disposed at opposite sides with respect to the multiplexer MUX. For example, the sensing channels SCH may be disposed at the right side with respect to the multiplexer MUX, and the gate control lines GCL may be disposed at the left side with respect to the multiplexer MUX.

The touch driving voltage line VDL and the touch ground voltage line VGL may be disposed between the gate control lines GCL and the multiplexer MUX. For example, the gate control lines GCL, the touch driving voltage line VDL, the touch ground voltage line VGL, and the multiplexer MUX may be sequentially disposed in the second direction DR2.

Similar to the arrangements depicted in FIGS. 9A, 9B, and 9C, the arrangement depicted in FIGS. 10A, 10B, and 10C can prevent noise that may be introduced from the first and second clock signals CLKL1 and CLKL2 and the scan start signal line STV by disposing the second power voltage line VSSL between the sensing channels SCH and the scan control lines CSL (e.g., the first and second clock signals CLKL1 and CLKL2 and the scan start signal line STV).

Instead of there being a space between the sensing channels SCH and the scan control lines CSL (e.g., the first and second clock signals CLKL1 and CLKL2 and the scan start signal line STV), the second power voltage line VSSL and the like may be spaced apart from one another, thereby reducing an area of the dead space.

FIG. 11A is an enlarged plan view illustrating one area of a scan driver of a display panel according to an embodiment of the present invention. FIGS. 11B and 11C are cross-sectional views taken along a line IV-IV' of FIG. 11A. In this case, FIG. 11B is a cross-sectional view corresponding to the arrangement illustrated in FIGS. 6A and 6B, and FIG. 11C is a cross-sectional view corresponding to the arrangement illustrated in FIGS. 7A to 7C.

The arrangement illustrated in FIGS. 11A, 11B, and 11C may be different from the arrangement illustrated in FIGS. 9A, 9B, and 9C in which the second power voltage line VSSL is disposed between the sensing channels SCH and the first clock signal line CLKL1, in that the second power voltage line VSSL is disposed between the touch contact hole CNT and the sensing channels SCH in a plan view. In this case, to prevent the touch contact hole CNT from being blocked, the touch contact hole CNT may be spaced apart from one end of the thin film encapsulation layer TFE by the first distance d1. For example, the first distance d1 from the touch contact hole CNT to one end of the thin film encapsulation layer TFE may be about 100 μm.

Similar to the arrangement illustrated in FIGS. 9A, 9B and 9C, the arrangement illustrated in FIGS. 11A, 11B, and 11C can prevent noise that may be introduced from the first and second clock signals CLKL1 and CLKL2 and the scan start signal line STV by disposing the multiplexer MUX, the gate control lines GCL, the touch driving voltage line VDL, and the ground voltage line VGL between the sensing channels SCH and scan control lines CSL (e.g., the first and second clock signals CLKL1 and CLKL2 and the scan start signal line STV).

The display panel DP (refer to FIG. 3) may include first and second dam units DMP1 and DMP2. For example, the first dam unit DMP1 may be disposed so as not to overlap the touch driving voltage line VDL and the ground voltage line VGL in the thickness direction (or the third direction DR3), and the second dam unit DMP2 may overlap the second power voltage line VSSL in the thickness direction (or the third direction DR3). One end of the thin film encapsulation layer TFE may be disposed not to overlap the multiplexer MUX in the thickness direction (or the third direction DR3).

Instead of there being a space between the sensing channels SCH and the scan control lines CSL (e.g., the first and second clock signals CLKL1 and CLKL2 and the scan start signal line STV), circuits and signal lines (e.g., the multiplexer MUX, the gate control lines GCL, the touch driving voltage line VDL, the ground voltage line VGL, and the second power voltage line VSSL, and the like) used to drive the display device DD may be spaced apart from one another, thereby also reducing an area of the dead space.

Figure 12A:
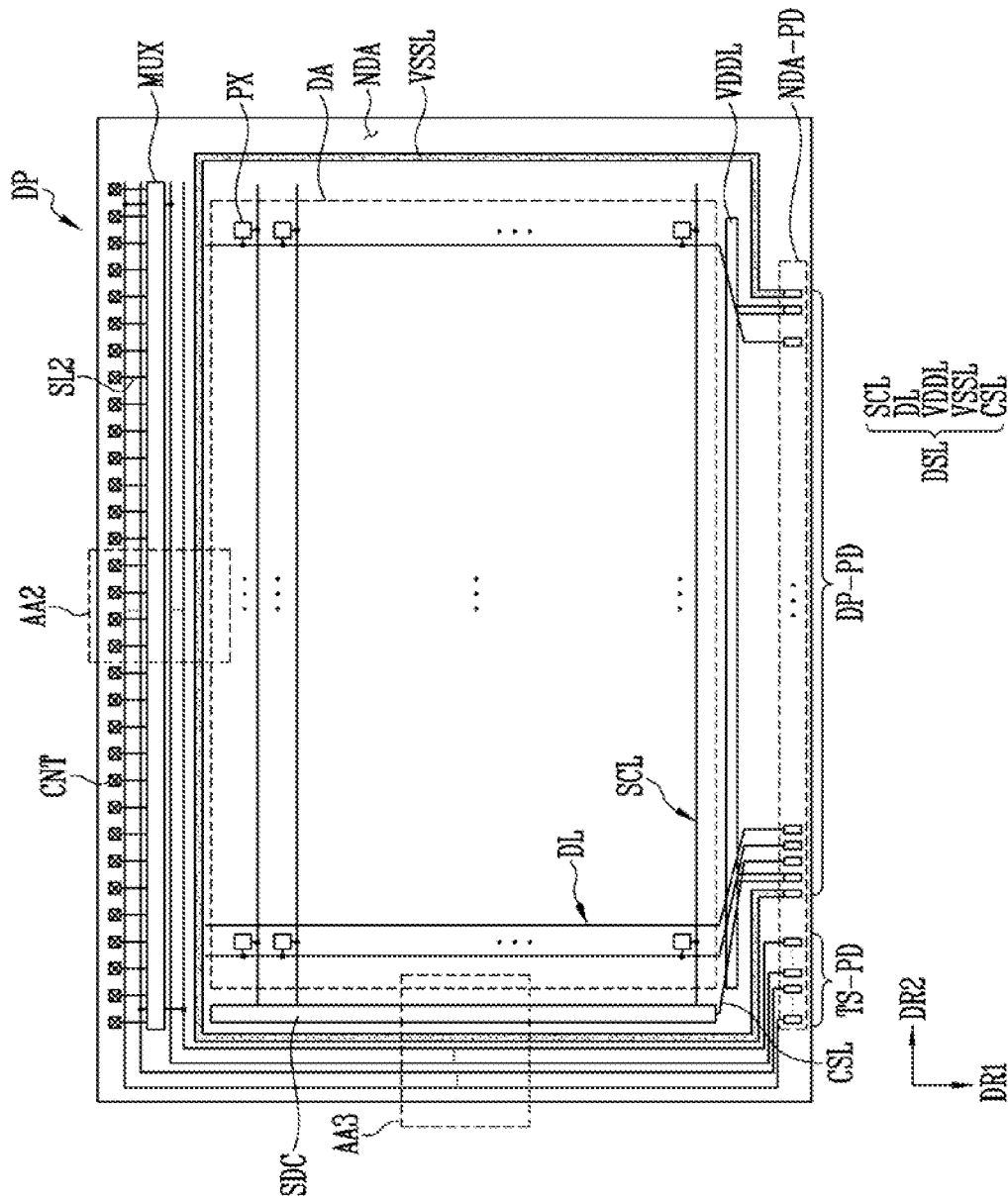
FIG. 12A is a plan view illustrating a display panel according to an embodiment of the present invention.
Figure 12B:
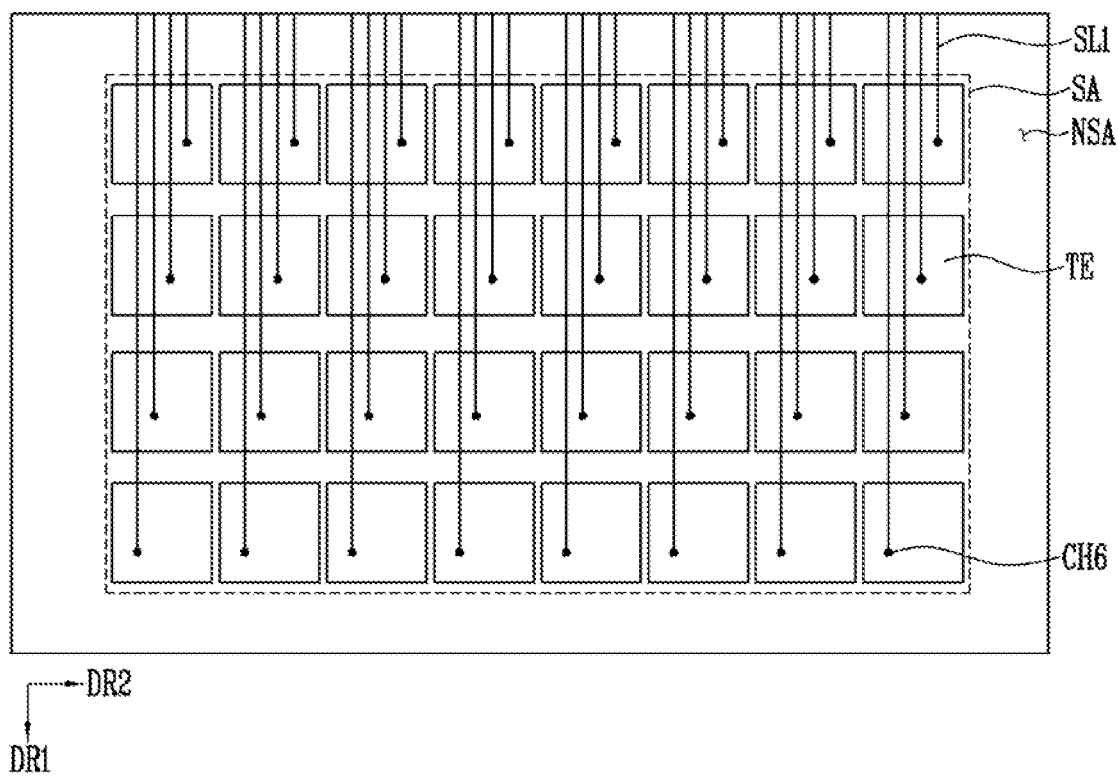
FIG. 12B is a plan view illustrating a touch sensing unit according to an embodiment of the present invention.
Figure 13A:
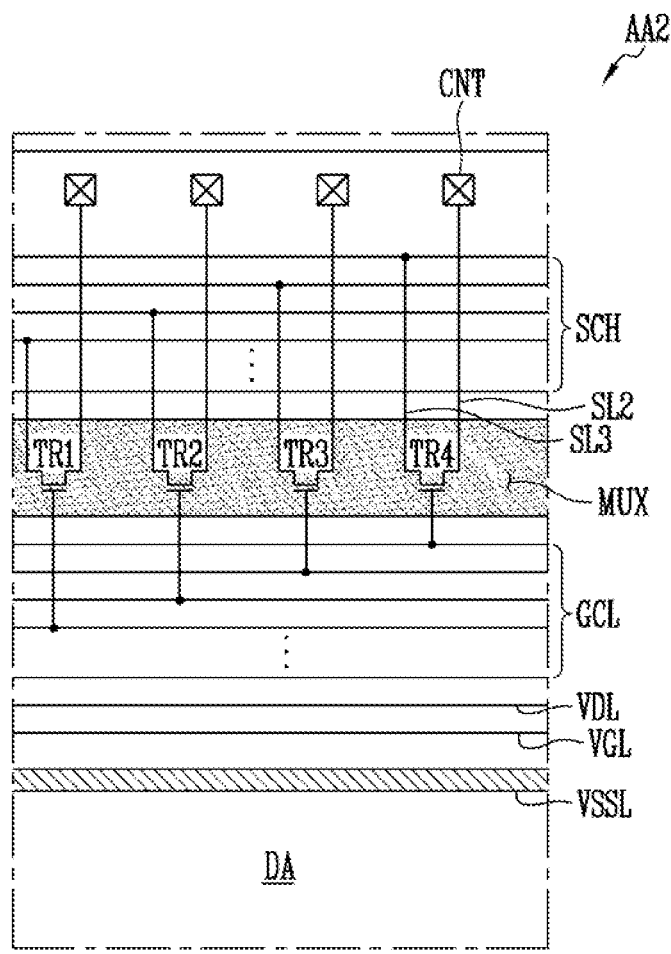
FIG. 13A is a plan view illustrating an enlarged area AA2 of FIG. 12A.
Figure 13B:
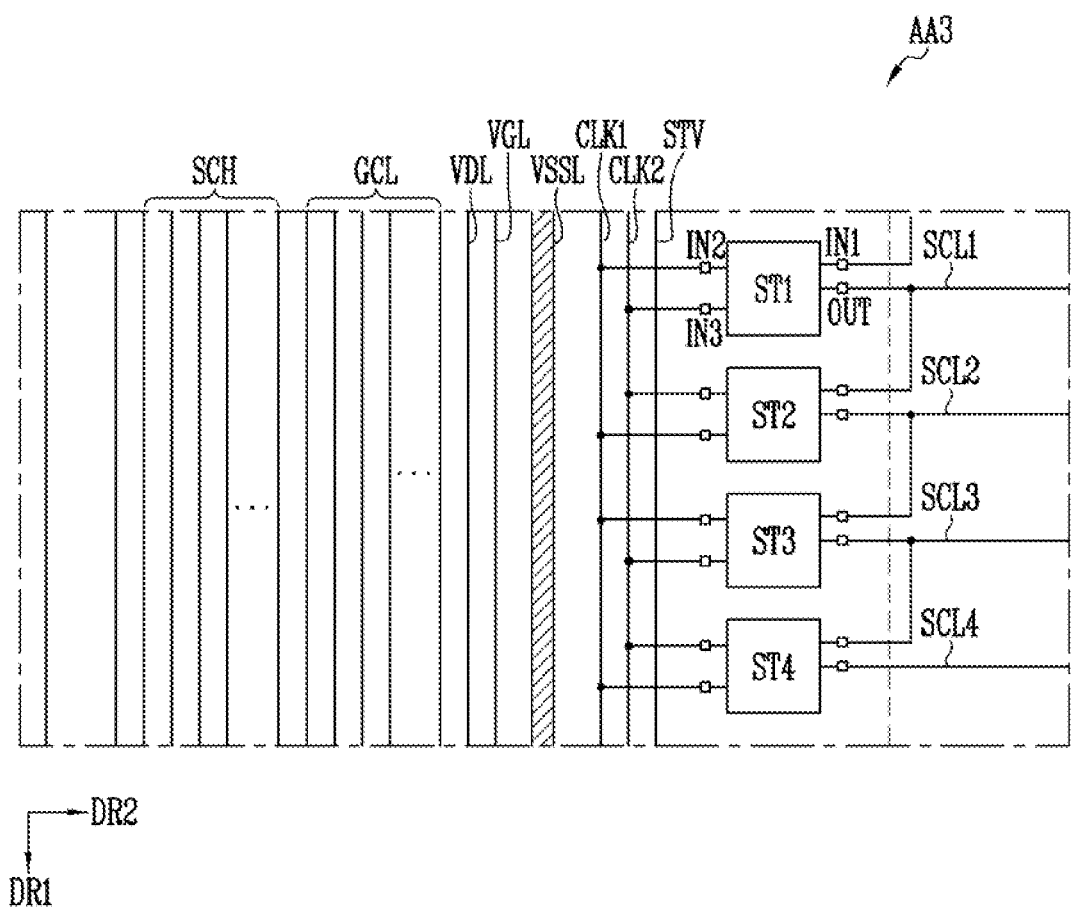
FIG. 13B is a plan view illustrating an enlarged area AA3 of FIG. 12A.

FIG. 12A is a plan view illustrating a display panel according to an embodiment of the present invention. FIG. 12B is a plan view illustrating a touch sensing unit according to an embodiment of the present invention. FIG. 13A is a plan view illustrating an enlarged area AA2 of FIG. 12A. FIG. 13B is a plan view illustrating an enlarged area AA3 of FIG. 12A.

The arrangements illustrated in FIGS. 12A to 13B may be different from the arrangement illustrated in FIG. 3 in which the multiplexer MUX is formed at the left side of the display panel DP, in that the multiplexer MUX is formed at the upper side of the display panel DP. To the extent that a detailed description of an element has been omitted, it may be assumed that this element is at least similar to corresponding elements that are described elsewhere in the Specification.

Referring to FIG. 12A, the display panel DP may include a display area DA and a non-display area NDA in a plan view. The plurality of touch contact holes CNT may be disposed in the non-display area NDA. According to an embodiment of the present invention, the touch contact holes CNT may be disposed in an upper non-display area NDA of the display panel DP. For example, the touch contact holes CNT may be arranged in a line in the second direction DR2 along the upper edge of the display panel DP.

Referring to FIG. 12B, the first touch sensing lines SL1 may extend in the first direction DR1 and may be arranged in the second direction DR2. One end of the first touch sensing lines SL1 may be connected to the touch electrodes TE, and the other end thereof may be connected to the second touch sensing lines SL2 through the touch contact hole CNT.

The number of touch contact holes CNT may match the number of touch electrodes TE formed on the thin film encapsulation layer TFE. For example, since the number of touch electrodes TE shown in FIG. 12B may be thirty-two, the number of touch contact holes CNT shown in FIG. 12A may also be thirty-two.

Referring to FIG. 13A, the multiplexer MUX may be disposed between the touch contact holes CNT and the second power voltage line VSSL. In the peripheral area of the multiplexer MUX, gate control lines GCL for controlling switching elements (or thin film transistors) included in the multiplexer MUX and touch driving voltage lines VDL for driving the touch sensing unit TS, and the touch ground voltage line VGL may be disposed. For example, in a direction from the display area DA to the upper end of the display panel DP (or the first direction DR1), the second power voltage line VGL, the touch ground voltage line, the touch driving voltage line VDL, the gate control lines GCL, the multiplexer MUX, and the sensing channels SCH may be sequentially disposed.

For convenience of description, the multiplexer MUX is shown as one so as to correspond to the length of one edge of the display area DA, but the size and number of the multiplexer MUX may be variously modified according to the number of the touch electrodes TE included in the touch sensing unit TS. Accordingly, when the multiplexer MUX is disposed in the upper non-display area NDA of the display panel DP, an extra space, for example, a space in which no elements are formed in the non-display area NDA can be utilized. For example, an effect of reducing an area of the dead space of the display panel DP can be achieved.

Referring to FIG. 13B, in a direction from the display area DA to the left end of the display panel DP (or the second direction DR2), the second power voltage line VSSL, the touch ground voltage line, the touch driving voltage line VDL, the gate control lines GCL, and the sensing channels SCH may be sequentially disposed. In this case, the second power voltage line VSSL, the touch ground voltage line VGL, the touch driving voltage line VDL, the gate control lines GCL, and the sensing channels SCH may be extended generally in the first direction DR1, and may be arranged in the second direction DR2.

Similar to the arrangement illustrated in FIG. 9, the arrangements illustrated in FIGS. 12A to 13B, can prevent noise that may be introduced from the first and second clock signals CLKL1 and CLKL2 and the scan start signal line STV by disposing the gate control lines GCL, the touch driving voltage line VDL, the ground voltage line VGL, and the second power voltage line VSSL between the sensing channels SCH and the scan control lines CSL (e.g., the first and second clock signals CLKL1 and CLKL2 and the scan start signal line STV. In particular, the second power voltage VSS supplied through the second power voltage line VSSL is a DC voltage and has excellent noise shielding characteristics.

Instead of there being a space between the sensing channels SCH and the scan control lines CSL (e.g., the first and second clock signals CLKL1 and CLKL2 and the scan start signal line STV), circuits and signal lines (e.g., the gate control lines GCL, the touch driving voltage line VDL, the ground voltage line VGL, and the second power voltage line VSSL, and the like) used to drive the display device DD may be spaced apart from one another, thereby also reducing an area of the dead space.

Figure 14:
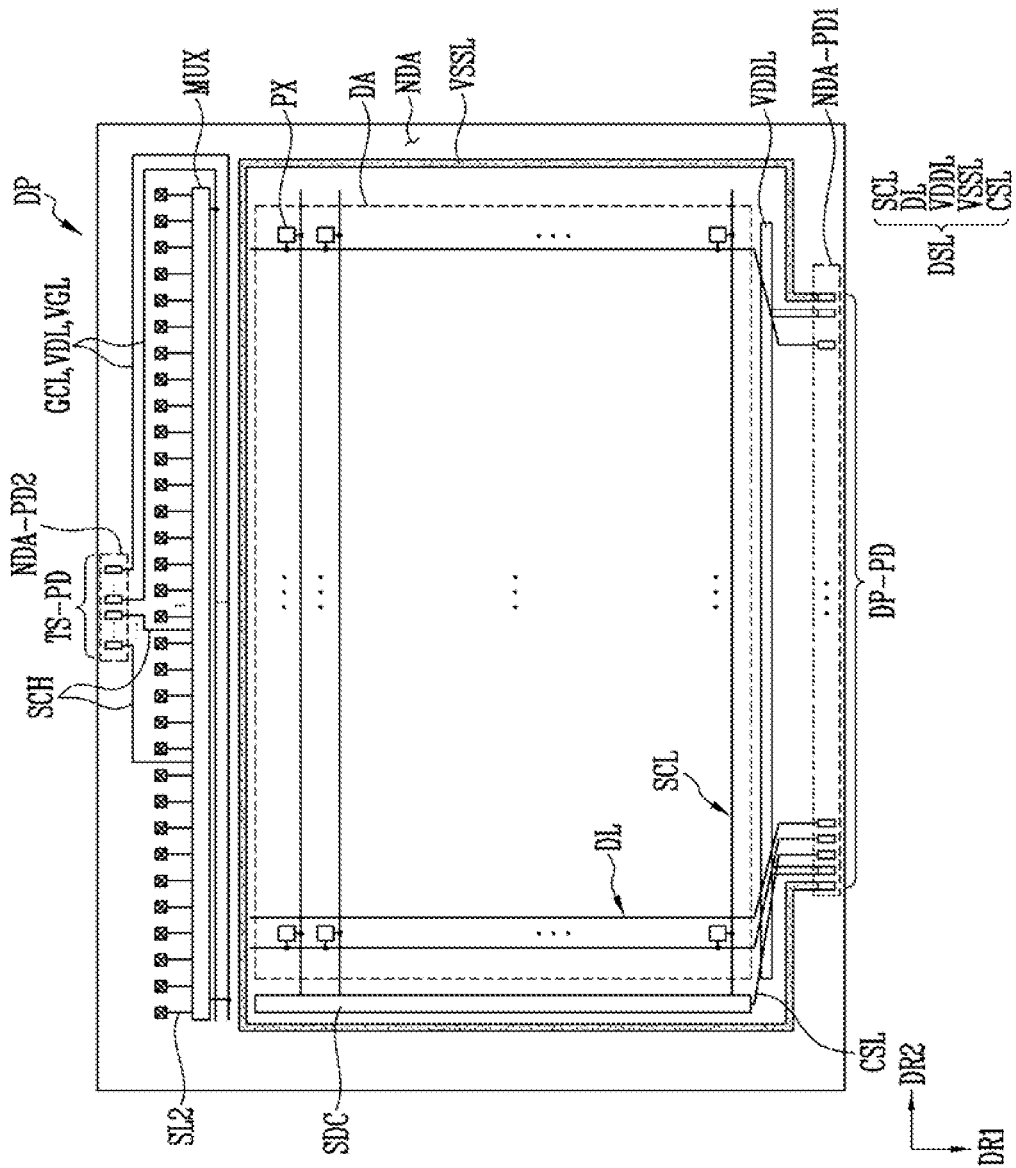
FIG. 14 is a plan view illustrating a display panel according to an embodiment of the present invention.

FIG. 14 is a plan view illustrating a display panel according to an embodiment of the present invention.

The arrangement illustrated in FIG. 14 may be different from the arrangements illustrated in FIGS. 12A to 13B in which the touch signal pads TS-PD are formed at the lower side of the display panel DP, in that the touch signal pads TS-PD are formed at the upper side of the display panel DP. To the extent that a detailed description of an element has been omitted, it may be assumed that this element is at least similar to corresponding elements that are described elsewhere in the Specification.

For example, referring to FIG. 14, the touch signal pads TS-PD may face the display signal pads DP-PD with the display area DA interposed therebetween. For example, the touch signal pads TS-PD may be formed in the upper non-display area NDA of the display area DA, and the display signal pads DP-PD may be formed in the lower non-display area NDA of the display area DA.

As the touch signal pads TS-PD are disposed in an area adjacent to the multiplexer MUX, the sensing channels SCH can directly connect the touch signal pads TS-PD to the multiplexer MUX without detouring the other area. Since the line lengths of the sensing channels SCH are reduced, an effect of reducing the probability of occurrence of RC delay and crosstalk can be achieved. For example, since the sensing channels SCH do not need to be detoured to the side of the scan driver SD, the probability that noise may be introduced from the first and second clock signals CLKL1 and CLKL2 and the scan start signal line STV may be significantly reduced.

Further, the thin film encapsulation layer TFE shown in FIG. 2 may cover the second power voltage line VSSL. When the touch contact hole CNT and the second power voltage line VSSL are adjacent to each other, the touch contact hole CNT may be blocked in the process of sealing the second power voltage line VSSL with the thin film encapsulation layer TFE. To prevent this, the first distance d1 from the touch contact hole CNT to one end of the thin film encapsulation layer TFE may be used. For example, the first distance d1 may be about 100 μm. In addition, in general, forming the touch contact hole CNT larger in consideration of the process margin causes the area of the dead space to increase.

According to the arrangement illustrated in FIG. 14, since the separation distance between the touch contact hole CNT and the second power voltage line VSSL is sufficiently large, even if the first distance d1 from the touch contact hole CNT is considered, a distance at which one end of the thin film encapsulation layer TFE can be formed can be secured as much as the second distance d2. Therefore, the touch contact hole CNT can be formed smaller than when the touch contact hole CNT and the second power voltage line VSSL are disposed adjacent to each other, thereby reducing an area of the dead space.

Figure 15:
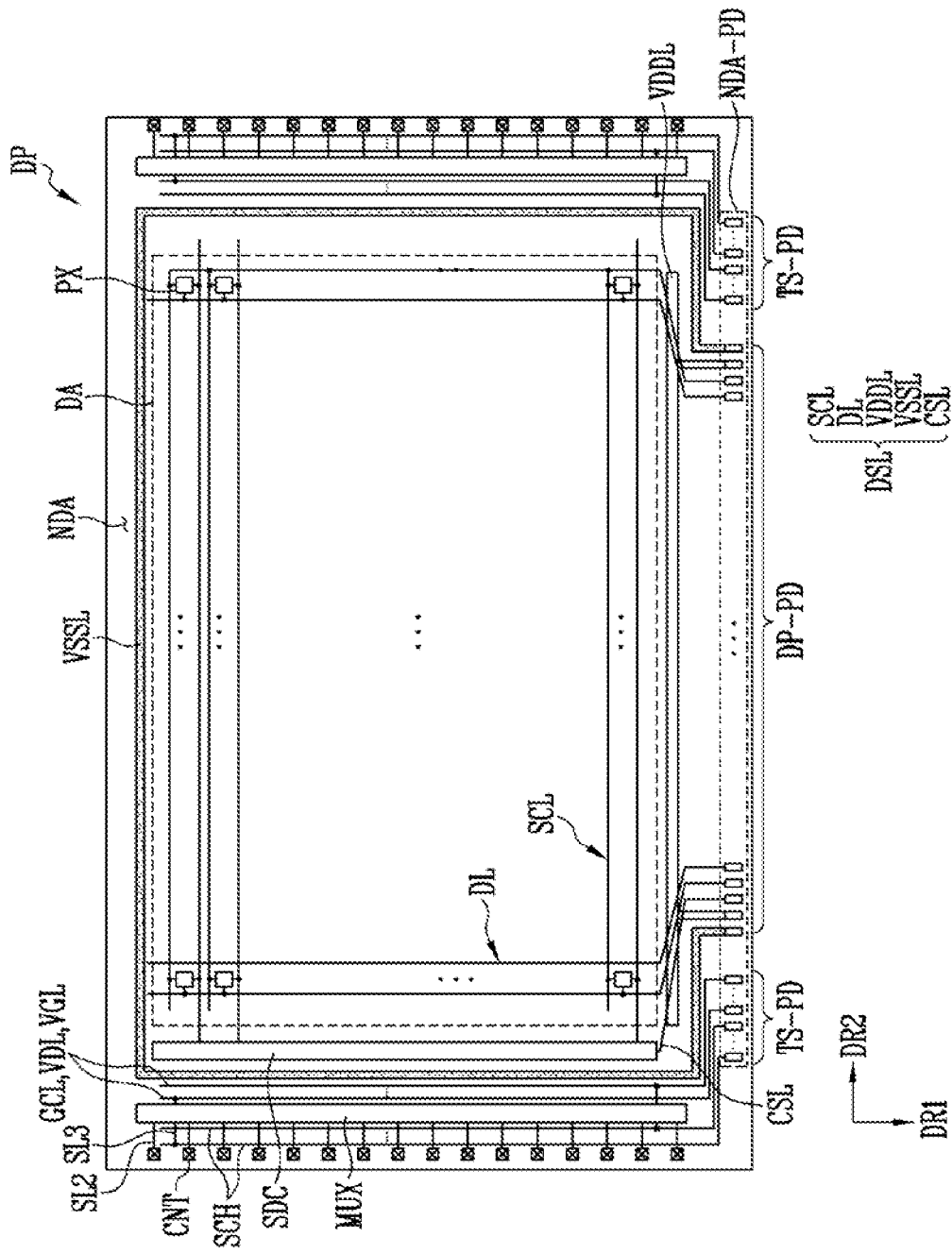
FIG. 15 is a plan view illustrating a display panel according to an embodiment of the present invention.
Figure 16:
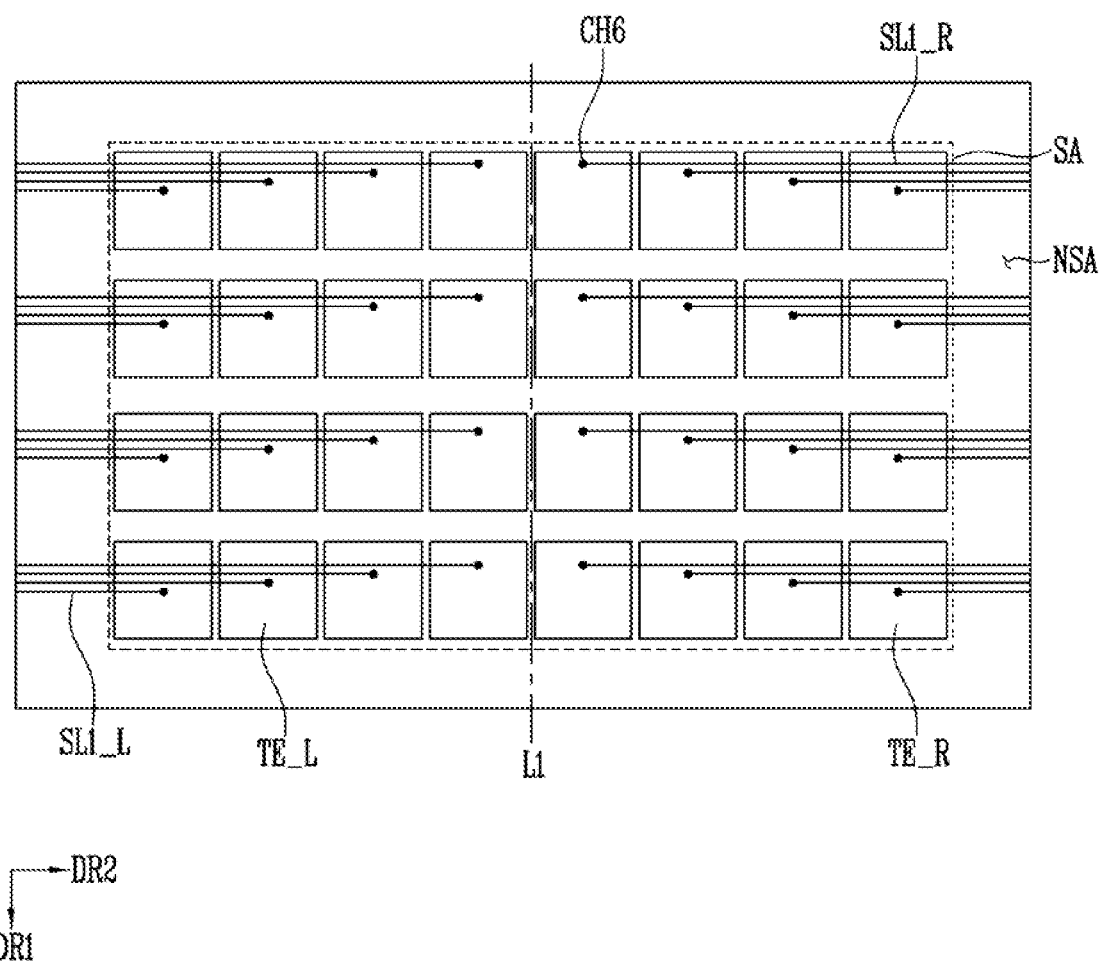
FIG. 16 is a plan view illustrating a touch sensing unit according to an embodiment of the present invention.
Figure 17:
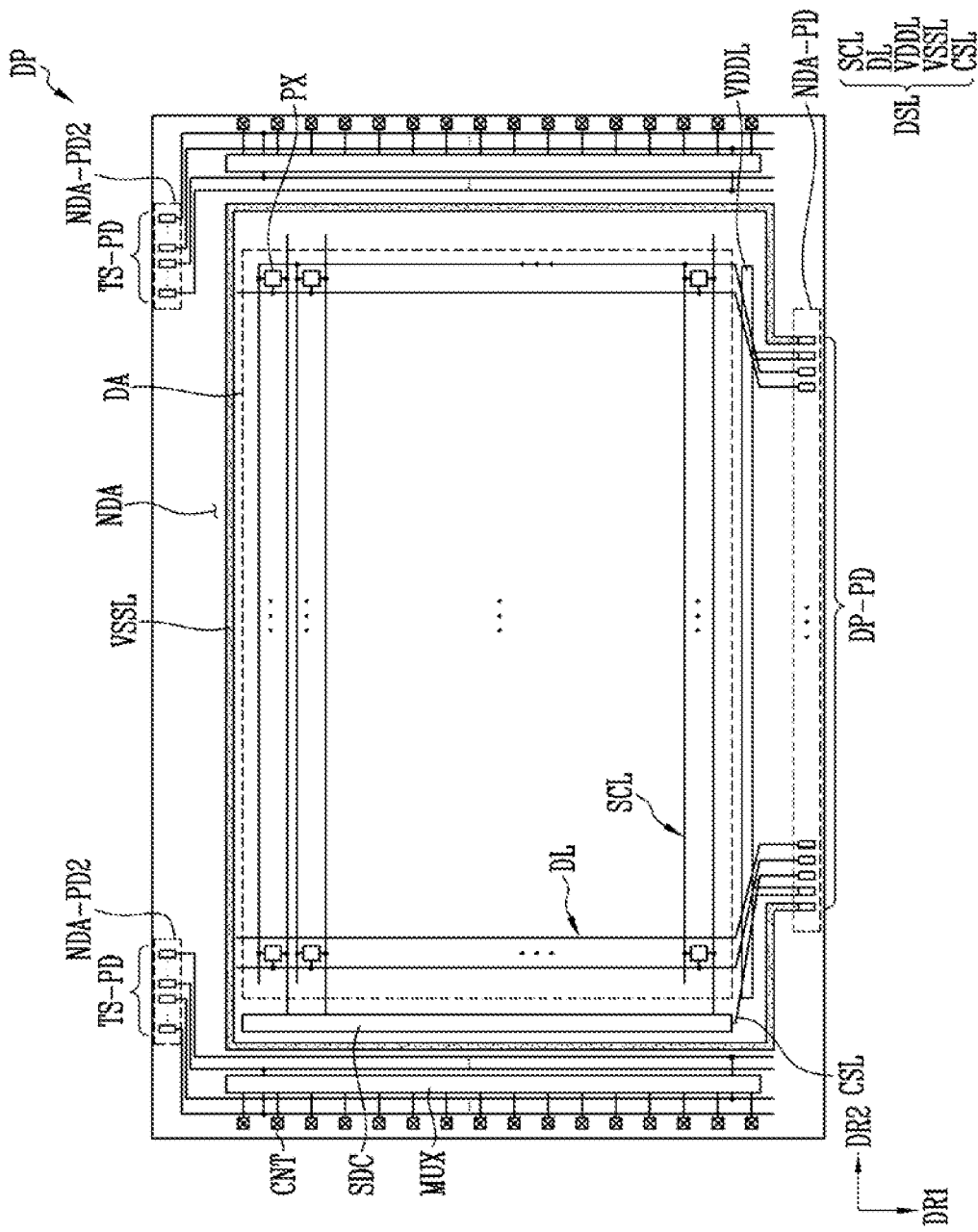
FIG. 17 is a plan view illustrating a display panel according to an embodiment of the present invention.

FIG. 15 is a plan view illustrating a display panel according to an embodiment of the present invention. FIG. 16 is a plan view illustrating a touch sensing unit according to an embodiment of the present invention. FIG. 17 is a plan view illustrating a display panel according to an embodiment of the present invention.

The arrangements illustrated in FIGS. 15 and 16 may be different from the arrangements illustrated in FIGS. 3, 6A, and 6B in that the multiplexer MUX is disposed not only at the left side of the display panel DP but also at the right non-display area NDA.

Referring to FIG. 15, the display panel DP may include the display area DA and the non-display area NDA in a plan view. The plurality of touch contact holes CNT may be disposed in the non-display area NDA. According to an embodiment of the present invention, the touch contact holes CNT may be disposed in each of the left and right non-display areas NDA of the display panel DP. For example, the touch contact holes CNT may be arranged in a line in the first direction DR1 along the left and right edges of the display panel DP.

Referring to FIG. 16, depending on whether first touch sensing lines SL1_L and SL1_R are connected to any of a touch electrode TE_L formed on the left side and a touch electrode TE_R formed on the right side with respect to a vertical center line L1 of the touch sensing unit TS, an extension direction thereof may change. For example, the first touch sensing lines SL1_L connected to the touch electrode TE_L formed on the left side may extend from right to left, and the first touch sensing lines SL1_R connected to the touch electrode TE_R formed on the right side may extend from left to right.

The arrangements illustrated in FIGS. 15 and 16 may provide substantially similar effects to the arrangements illustrated in FIGS. 3, 6A, and 6B. Further, since the first touch sensing lines SL1_L and SL1_R are divided into two groups and connected to the adjacent touch signal pads TS-PD, line lengths of the first touch sensing lines SL1_L and SL1_R may be reduced. Therefore, the effect of reducing the RC delay and reducing the inflow of noise from the outside can be achieved.

The arrangement illustrated in FIG. 17 may be different from the arrangements illustrated in FIGS. 15 and 16 formed in which the touch signal pads TS-PD are formed in the lower non-display area NDA of the display panel DP in that the touch signal pads TS-PD are formed in the upper non-display area NDA of the display panel DP.

The touch signal pads TS-PD may be disposed to face the display signal pads DP-PD with the display area DA interposed therebetween. Therefore, the effect of reducing noise that may be flowed from the display signal pads DP-PD to the touch signal pads TS-PD can be achieved.

Figure 18:
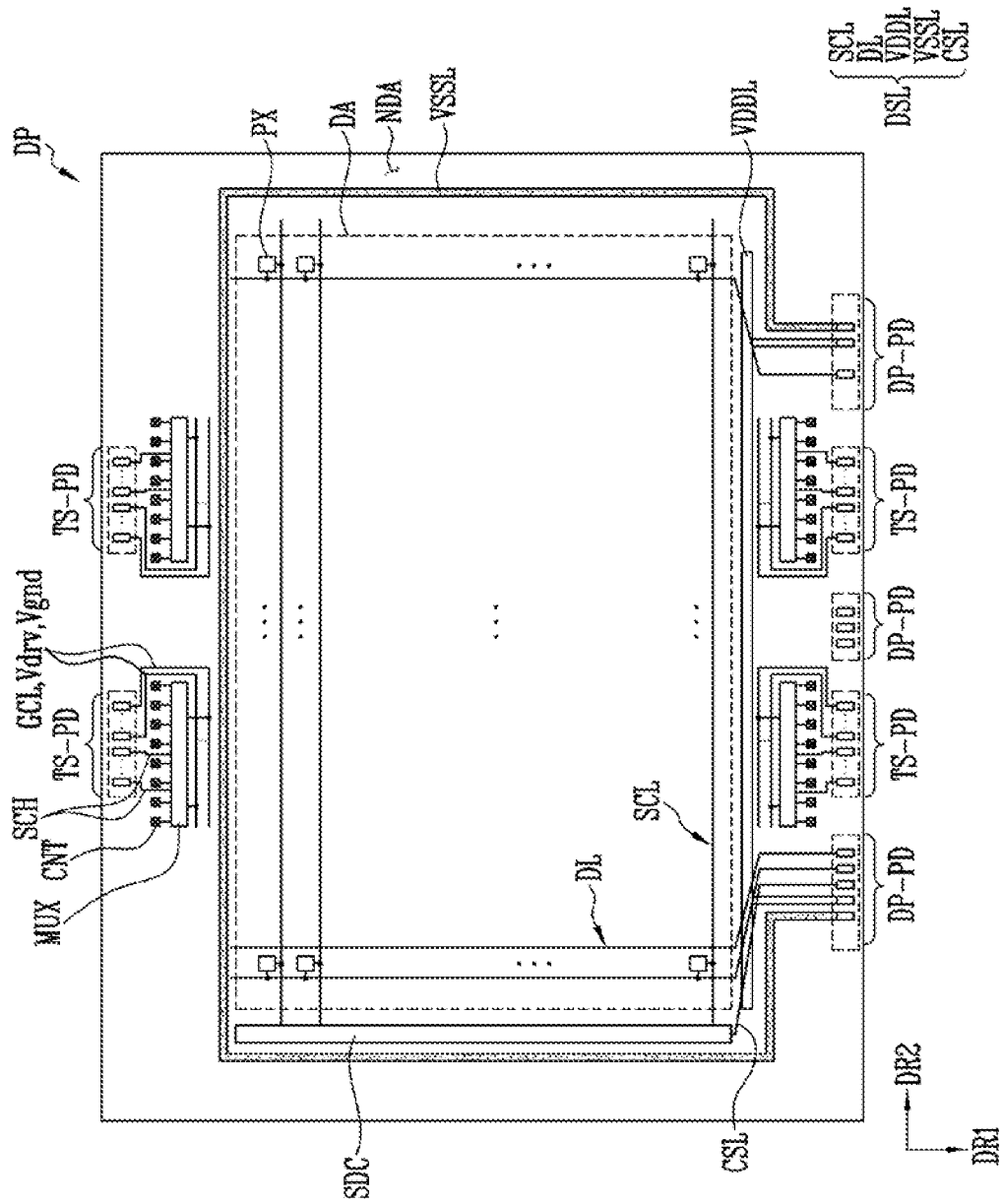
FIG. 18 is a plan view illustrating a display panel according to an embodiment of the present invention.
Figure 19:
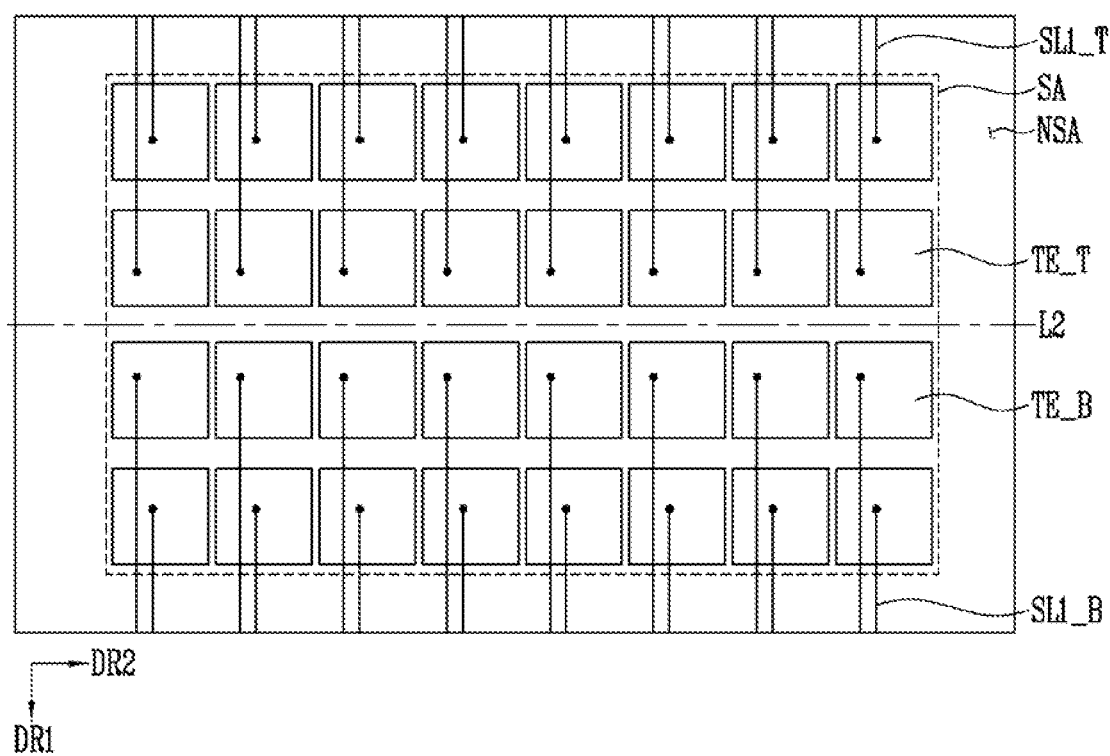
FIG. 19 is a plan view illustrating a touch sensing unit according to an embodiment of the present invention.

FIG. 18 is a plan view illustrating a display panel according to an embodiment of the present invention. FIG. 19 is a plan view illustrating a touch sensing unit according to an embodiment of the present invention.

The arrangements illustrated in FIGS. 18 and 19 may be different from the arrangement illustrated in FIG. 14 in that the multiplexer MUX is disposed not only in the upper non-display area NDA of the display panel DP, but also in the lower non-display area NDA of the display panel DP.

Referring to FIG. 18, a plurality of multiplexers MUX may be disposed in the non-display area NDA. According to an embodiment of the present invention, the multiplexers MUX may be disposed in each of the upper and lower non-display areas NDA of the display panel DP. For example, two multiplexers MUX may be disposed around the upper edge of the display panel DP and two multiplexers MUX may be disposed around the lower edge of the display panel DP. However, this is illustrative and the present invention is not necessarily limited thereto.

Referring to FIG. 19, depending on whether the first touch sensing lines SL1_T and SL1_B are connected to any of a touch electrode TE_T formed on the upper side and a touch electrode TE_B formed on the lower side with respect to a horizontal center line L1 of the touch sensing unit TS, an extension direction thereof may change. For example, the first touch sensing lines SL1_T connected to the touch electrode TE_T formed on the upper side may extend from the lower side to the upper side, and the first touch sensing lines SL1_B connected to the touch electrode TE_B formed on the lower side may extend from the upper side to the lower side.

In the arrangements illustrated in FIGS. 18 and 19, since the first touch sensing lines SL1T and SL1_B are divided into two groups and connected to the adjacent touch signal pads TS-PD, the line lengths of the first touch sensing lines SL1T and SL1_B can be reduced. Therefore, the effect of reducing the RC delay and reducing the inflow of noise from the outside can be achieved.

In addition, as the touch signal pads TS-PD are disposed in an area adjacent to the multiplexer MUX, the sensing channels SCH can directly connect the touch signal pads TS-PD to the multiplexer MUX without detouring the other area. Since the line lengths of the sensing channels SCH are reduced, an effect of reducing the probability of occurrence of RC delay and crosstalk can be achieved.

Further, when the multiplexer MUX is disposed in the upper and lower non-display areas NDA of the display panel DP, an extra space in the non-display area NDA, that is, a space in which no elements are formed may be utilized. For example, an effect of reducing an area of the dead space of the display panel DP can be achieved.

While embodiments of the present invention have been shown and described with reference to the figures, it will be understood by those skilled in the art that various changes in forms and details may be made therein without departing from the spirit and scope of the present invention.

What is claimed is:

1. A display device, comprising:
   a display panel including pixels and a scan driver for driving the pixels, the pixels being disposed within a display area and the scan driver being disposed in a non-display area; and
   a touch sensing unit disposed on the display panel and including touch electrodes disposed in a sensing area and touch sensing lines connected to the touch electrodes;
   wherein at least one multiplexer is disposed within the non-display area,
   wherein the touch sensing lines are electrically connected to input terminals of the at least one multiplexer through touch contact holes formed in the display panel,
   wherein sensing channels electrically connected to output terminals of the at least one multiplexer run parallel to the scan driver, and
   wherein the at least one multiplexer is disposed between the scan driver and the sensing channels.

2. The display device of claim 1, wherein
   the at least one multiplexer includes a plurality of switching elements, and gate control lines for controlling the plurality of switching elements are disposed on one side of the at least one multiplexer.

3. The display device of claim 2, wherein
   a number of the touch sensing lines is greater than a number of the sensing channels.

4. The display device of claim 2, wherein
   the sensing channels and the gate control lines are disposed on opposite sides of the at least one multiplexer.

5. The display device of claim 2, wherein
   the gate control lines are disposed in parallel to the sensing channels.

6. The display device of claim 2, wherein
   the scan driver includes stages for providing a scan signal to each of the pixels.

7. The display device of claim 6, wherein
   scan control lines for driving the stages are disposed on one side of the stages.

8. The display device of claim 7, wherein
   the scan control lines include a first clock signal line, a second clock signal line, and a scan start signal line.

9. The display device of claim 7, wherein
the scan control lines are disposed between the sensing channels and the stages.

10. The display device of claim 9, further comprising:
a second power voltage line extending in parallel to the scan control lines, wherein a second power voltage supplied through the second power voltage line is a DC voltage.

11. The display device of claim 10, wherein
the second power voltage line is disposed between the gate control lines and the scan control lines.

12. The display device of claim 10, wherein
the sensing channels are disposed between the second power voltage line and the scan control lines.

13. The display device of claim 7, further comprising:
a touch driving voltage line and a touch ground voltage line disposed between the scan control lines and the gate control lines.

14. The display device of claim 1, wherein
the touch sensing unit includes a conductive layer and an insulating layer.

15. The display device of claim 14, wherein
the conductive layer includes the touch electrode and the touch sensing lines.

16. A display device, comprising:
a display panel including pixels and a scan driver for driving the pixels, the pixels being disposed within a display area and the scan driver being disposed in a non-display area; and
a touch sensing unit disposed on the display panel and including touch electrodes disposed in a sensing area and touch sensing lines connected to the touch electrodes;
wherein at least one multiplexer is disposed within the non-display area,
wherein the touch sensing lines are electrically connected to input terminals of the at least one multiplexer through a touch contact hole formed in the display panel,
wherein sensing channels electrically connected to output terminals of the at least one multiplexer are connected to touch signal pads formed in one area of the non-display area,
wherein scan control lines for controlling the scan driver are connected to display signal pads formed in one area of the non-display area, and
wherein the touch signal pads and the display signal pads are disposed on opposite sides of the display panel.

17. The display device of claim 16, wherein
the at least one multiplexer includes a plurality of switching elements, and gate control lines for controlling the plurality of switching elements are disposed on one side of the at least one multiplexer.

18. The display device of claim 17, wherein
the sensing channels and the gate control lines are disposed on opposite sides of the at least one multiplexer.

19. The display device of claim 18, further comprising:
a second power voltage line connected to the display signal pads, wherein the gate control lines are disposed between the second power voltage line and the at least one multiplexer.

20. The display device of claim 16, wherein
the scan control lines include a first clock signal line, a second clock signal line, and a scan start signal line.

21. A display device, comprising:
a display panel including pixels and a scan driver for driving the pixels, the pixels being disposed in a display area and the scan driver being disposed in a non-display area; and
a touch sensing unit disposed on the display panel and including touch electrodes disposed in a sensing area and touch sensing lines connected to the touch electrodes;
wherein the non-display area includes at least one multiplexer,
wherein the touch sensing lines are electrically connected to input terminals of the at least one multiplexer through touch contact holes formed in the display panel,
wherein sensing channels electrically connected to output terminals of the at least one multiplexer are parallel to the scan driver, and
wherein a second power voltage line is disposed between the sensing channels and the scan driver and is parallel to the sensing channels and the scan driver.

22. The display device of claim 21, wherein
the at least one multiplexer includes a plurality of switching elements, and gate control lines for controlling the plurality of switching elements are disposed on one side of the at least one multiplexer.

23. The display device of claim 22, wherein
the sensing channels and the gate control lines are disposed on opposite sides of the at least one multiplexer.

24. The display device of claim 23, further comprising:
a touch driving voltage line and a touch ground voltage line disposed between the gate control lines and the at least one multiplexer.

25. The display device of claim 21, wherein
the scan driver includes stages for providing a scan signal to each of the pixels,
scan control lines for driving the stages are disposed on one side of the stages, and
the scan control lines include a first clock signal line, a second clock signal line, and a scan start signal line.

26. The display device of claim 25, wherein
the scan control lines are disposed between the second power voltage line and the stages.

27. The display device of claim 21, wherein
a second power voltage supplied through the second power voltage line is a DC voltage.

* * * * *